US011152507B2

(12) United States Patent
Zhang et al.

(10) Patent No.: US 11,152,507 B2
(45) Date of Patent: Oct. 19, 2021

(54) VERTICAL FIELD-EFFECT TRANSISTOR WITH A BOTTOM CONTACT THAT EXHIBITS LOW ELECTRICAL RESISTANCE

(71) Applicant: International Business Machines Corporation, Armonk, NY (US)

(72) Inventors: Chen Zhang, Albany, NY (US); Tenko Yamashita, Schenectady, NY (US); Terence B Hook, Jericho, VT (US); Brent Alan Anderson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 2 days.

(21) Appl. No.: 16/183,214

(22) Filed: Nov. 7, 2018

(65) Prior Publication Data

US 2020/0144416 A1 May 7, 2020

(51) Int. Cl.
*H01L 29/76* (2006.01)
*H01L 29/78* (2006.01)
*H01L 29/08* (2006.01)
*H01L 27/088* (2006.01)
*H01L 29/417* (2006.01)
*H01L 29/66* (2006.01)

(52) U.S. Cl.
CPC ........ *H01L 29/7827* (2013.01); *H01L 27/088* (2013.01); *H01L 29/0847* (2013.01); *H01L 29/41741* (2013.01); *H01L 29/66666* (2013.01)

(58) Field of Classification Search
CPC .............. H01L 27/088; H01L 29/7827; H01L 27/0883; H01L 27/0886; H01L 29/0847; H01L 29/78642
See application file for complete search history.

(56) References Cited

U.S. PATENT DOCUMENTS

| | | | |
|---|---|---|---|
| 6,770,534 B2 | 8/2004 | Cho et al. | |
| 7,683,428 B2 | 3/2010 | Chidambarrao et al. | |
| 9,530,866 B1* | 12/2016 | Zhang | ................. H01L 29/0676 |
| 9,761,491 B1 | 9/2017 | Huang et al. | |
| 9,773,913 B1* | 9/2017 | Balakrishnan | .... H01L 29/78618 |
| 9,859,384 B2 | 1/2018 | Mallela et al. | |
| 2006/0261406 A1 | 11/2006 | Chen | |
| 2017/0179116 A1* | 6/2017 | Anderson | ............. H01L 29/665 |
| 2018/0090598 A1 | 3/2018 | Xie et al. | |

* cited by examiner

*Primary Examiner* — Samuel A Gebremariam
(74) *Attorney, Agent, or Firm* — Amin, Turocy & Watson, LLP

(57) ABSTRACT

Techniques regarding one or more VFETs operably coupled to bottom contacts with low electrical resistance are provided. For example, one or more embodiments described herein can comprise an apparatus, which can comprise a vertical field-effect transistor device that can comprise a semiconductor fin positioned on a source/drain region, which can comprise a semiconductor substrate. The apparatus can also comprise a metal contact layer positioned on the source/drain region and at least partially surrounding a base of the semiconductor fin. Further, the metal contact layer can be in electrical communication with the source/drain region.

13 Claims, 14 Drawing Sheets

VERTICAL FIELD-EFFECT TRANSISTOR WITH A BOTTOM CONTACT THAT EXHIBITS LOW ELECTRICAL RESISTANCE

BACKGROUND

The subject disclosure relates to one or more semiconductor devices comprising a vertical field-effect transistor ("VFET") device operably coupled to a bottom contact with low electrical resistance, and more specifically, to one or more bottom contacts with increased contact area between a source/drain ("S/D") region of the VFET device.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses and/or methods regarding VFETs operably coupled to a bottom contact that has a large contact area with a bottom S/D region are described.

According to an embodiment, an apparatus is provided. The apparatus can comprise a vertical field-effect transistor device that can comprise a semiconductor fin positioned on a source/drain region, which can comprise a semiconductor substrate. The apparatus can also comprise a metal contact layer positioned on the source/drain region and at least partially surrounding a base of the semiconductor fin. Further, the metal contact layer can be in electrical communication with the source/drain region.

According to an embodiment, an apparatus is provided. The apparatus can comprise a vertical field-effect transistor device that can comprise a semiconductor fin extending from an epitaxial wafer. The apparatus can also comprise a metal contact layer positioned on the epitaxial wafer and at least partially surrounding a base of the semiconductor fin. Further, the metal contact layer can be in contact with the base of the semiconductor fin and the epitaxial wafer.

According to an embodiment, a method is provided. The method can comprise depositing a sacrificial layer between a source/drain region and an electrically insulating spacer of a vertical field-effect transistor device. The method can also comprise replacing the sacrificial layer with a metal contact layer to form a metal contact that can be in electrical communication with the source/drain region and partially surround a base of a semiconductor fin comprising the vertical field-effect transistor device.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, cross-hatching and/or shading can be used throughout the drawings to denote like referenced materials, compositions, and/or features.

Conventional VFET devices can comprise a semiconductor fin positioned between a top S/D region and a bottom S/D region. Further, the top S/D region and/or the bottom S/D region can be formed from doped semiconductor material. Thus, a current path through the VFET device can flow through doped semiconductor material, wherein electrical resistance can increase as the current path becomes longer. Also, conventional VFET devices can comprise an interface between a bottom metal contact and the bottom S/D region that can be substantially smaller that an interface between a top metal contact and the top S/D region. The smaller interface between the bottom metal contact and the bottom S/D region can result in long current paths, thereby rendering high electrical resistance.

Various embodiments described herein can regard apparatuses and/or methods comprising one or more VFET devices operably coupled to a bottom contact that can exhibit reduced electrical resistance, as compared to conventional VFET architectures. For example, in one or more embodiments the bottom contact can be positioned on the top surface of a bottom S/D region for the VFET device. Further, the VFET device can comprise a semiconductor fin, wherein the bottom contact can extend around a base of the semiconductor fin. For instance, the bottom contact can be adjacent to, and/or in contact with, a plurality of sidewalls of the base of the semiconductor fin. Therefore, the bottom contact can at least partially surround the base of the semiconductor fin while also sharing a large contact area with the bottom S/D region. Advantageously, the large contact area between the bottom contact and the bottom S/D region can reduce the electrical resistance exhibited by the bottom contact. Additionally, one or more embodiments described herein can regard one or more methods to facilitate manufacturing of the one or more apparatuses described herein.

Figure 1A:
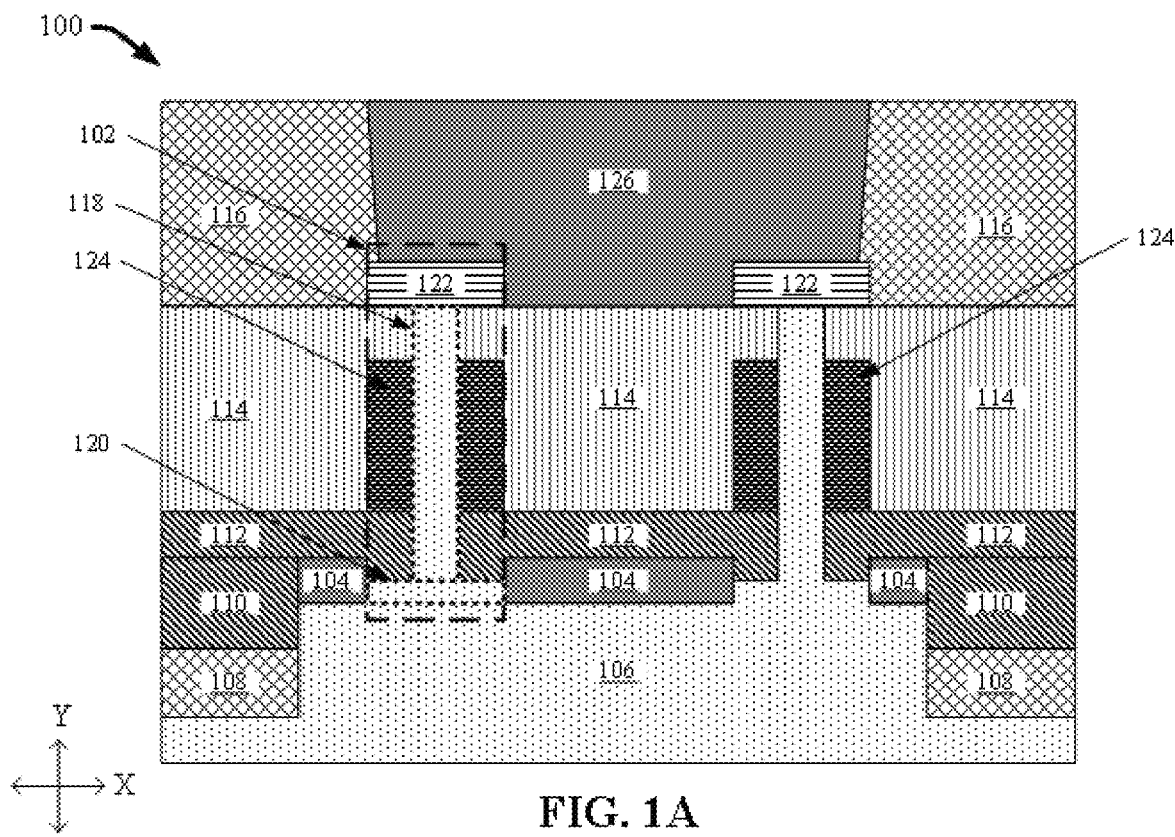
FIG. 1A illustrates a diagram of an example, non-limiting cross-sectional view of a semiconductor device comprising one or more VFETs operably coupled to one or more bottom contacts positioned on a bottom S/D region in accordance with one or more embodiments described herein.

FIG. 1A illustrates a diagram of an example, non-limiting first cross-sectional view of a semiconductor device 100 that can comprise a VFET device 102 operably coupled to a bottom contact 104 that has a large shared contact area with one or more bottom S/D regions. FIG. 1A depicts two VFET devices 102 positioned on a semiconductor substrate 106, wherein one of the VFET devices 102 is delineated with dashed lines for clarity. In one or more embodiments, one or more portions of the semiconductor substrate 106 can serve as a bottom S/D region for the one or more VFET devices 102.

Example materials that can comprise the semiconductor substrate 106 can include, but are not limited to: silicon, germanium, silicon carbide, carbon doped silicon, compound semiconductors (e.g., comprising elements from periodic table groups III, IV, and/or V), silicon dioxide, a combination thereof, and/or the like. For instance, the semiconductor substrate 106 can be a bulk silicon wafer and/or a silicon-on-insulator ("SOI") wafer. Additionally, the semiconductor substrate 106 can comprise electronic structures such as isolation wires (not shown). Further, the semiconductor substrate 106 can be characterized by one or more crystalline structures. For example, the semiconductor substrate 106 can comprise silicon <100>, silicon <110>, and/or silicon <111>, as described using Miller indices. One of ordinary skill in the art will readily recognize that the thickness of the semiconductor substrate 106 can vary depending on the composition of the semiconductor substrate 106 and/or the functionality of the semiconductor device 100 being manufactured. In one or more embodiments, the semiconductor substrate 106 can be an epitaxial wafer.

As shown in FIG. 1, the semiconductor device 100 can comprise one or more first interlayer dielectric ("ILD") layers 108 positioned adjacent to one or more S/D regions of the semiconductor substrate 106. The one or more first ILD layers 108 can comprise one or more dielectric materials, which can include but are not limited to: silicon dioxide, silicon nitride, hydrogenated silicon carbon oxide, silicon based low dielectric constant ("low-k") dielectrics, porous dielectrics, organic dielectrics, a combination thereof, and/or the like. Additionally, one or more insulating layers 110 can be positioned on top of the one or more first ILD layers 108. The one or more insulating layers 110 can be electrically insulating. Example materials that can comprise the one or more insulating layers 110 can include, but are not limited to: silicon nitride ("SiN"), silicon-boron-carbide-nitride ("SiBCN"), silaketenylidene ("SiCO"), silicon oxycarbonitride ("SiOCN"), a combination thereof, and/or the like.

Further, one or more bottom spacers 112 can be positioned on top of the one or more insulating layers 110. In one or more embodiments, the one or more bottom spacers 112 can also be electrically insulating. Example materials that can comprise the one or more bottom spacers 112 can include, but are not limited to: silicon nitride ("SiN"), silicon-boron-carbide-nitride ("SiBCN"), silaketenylidene ("SiCO"), silicon oxycarbonitride ("SiOCN"), a combination thereof, and/or the like. In various embodiments, the one or more bottom spacers 112 can comprise the same, or substantially the same, composition as the one or more insulating layers 110 (e.g., as shown in FIG. 1A). For example, the one or more bottom spacers 112 and/or the one or more insulating layers 110 can both comprise silicon nitride.

Additionally, one or more top spacers 114 can be positioned on top of the one or more bottom spacers 112. In one or more embodiments, the one or more top spacers 114 can also be electrically insulating. Example materials that can comprise the one or more top spacers 114 can include, but are not limited to: silicon nitride ("SiN"), silicon-boron-carbide-nitride ("SiBCN"), silaketenylidene ("SiCO"), silicon oxycarbonitride ("SiOCN"), a combination thereof, and/or the like. Moreover, one or more second ILD layers 116 can be positioned over the one or more top spacers 114. The one or more second ILD layers 116 can comprise one or more dielectric materials, which can include but are not limited to: silicon dioxide, silicon nitride, hydrogenated silicon carbon oxide, silicon based low dielectric constant ("low-k") dielectrics, porous dielectrics, organic dielectrics, a combination thereof, and/or the like. In one or more embodiment, the one or more first ILD layers 108 and the one or more second ILD layers 116 can comprise the same, or substantially the same, composition (e.g., as shown in FIG. 1A).

The one or more VFET devices 102 can comprise a semiconductor fin 118 extending from the semiconductor substrate 106. As shown in FIG. 1A, the semiconductor fin 118 of one of the VFET devices 102 depicted in FIG. 1A is delineated by dashed lines for clarity. Additionally, the semiconductor fin 118 can comprise the same, or substantially the same, composition as the semiconductor substrate 106 (e.g., as shown in FIG. 1A). A base 120 of the semiconductor fin 118 can be positioned on and/or extend from the semiconductor substrate 106. For example, the base 120 of the semiconductor fin 118 can comprise the same, or substantially the same, composition as the semiconductor substrate 106 (e.g., as shown in FIG. 1A). Further, the base 120 can be positioned on portion of the semiconductor substrate 106 that can act as a bottom S/D region for the respective VFET device 102. For example, the base 120 can be positioned on one or more doped regions of the semiconductor substrate 106. As shown in FIG. 1A, a base 120 of a semiconductor fin 118 of one of the VFET devices 102 depicted in FIG. 1A is delineated by dashed lines for clarity.

The one or more VFET devices 102 can also comprise a top S/D region 122 located at the distal end of the semiconductor fin 118 opposite the base 120. In one or more embodiments, the top S/D region 122 can comprise doped semiconductor material. For example, the top S/D region 122 can be a doped epaxial wafer. In addition, the one or more VFET devices 102 can comprise a metal gate structure 124 positioned adjacent to a center portion of the semiconductor fin 118. The metal gate structure 124 can comprise a gate electrode and/or one or more high dielectric constant ("high-k") layers. For example, the gate electrode (not shown) can comprise a low-resistance conductive material, including, but not limited to: tungsten, aluminum, any metallic or conductive material commonly used to form gate electrode structures, a combination thereof, and/or the like. Also, the one or more high-k layers (not shown) can comprise one or more high-k dielectric layers and/or one or more work function metal layers. Example dielectric materials that can comprise the one or more high-k dielectric layers can include, but are not limited to: hafnium dioxide ("$HfO_2$"), hafnium(IV) silicate ("$HfO_4Si$"), zirconium oxide ("$ZrO_2$"), aluminum oxide ("$Al_2O_3$"), titanium oxide ("$TiO_2$"), strontium titanate ("$SrTiO_3$"), lanthanum aluminate ("$LaAlO_3$"), a combination thereof, and/or the like. Example materials that can comprise the one more work function metal layers can include, but are not limited to: zirconium ("Zr"), tungsten ("W"), tantalum ("Ta"), hafnium ("Hf"), titanium ("Ti"), aluminum ("Al"), ruthenium ("Ru"), protactinium ("Pa"), tantalum nitride ("TaN"), metal oxides, metal carbides, metal nitrides, transition metal aluminides, tantalum carbide ("TaC"), titanium carbide ("TiC"), a combination thereof, and/or the like.

As shown in FIG. 1A, the metal gate structure 124 can be electrically isolated from the one or more bottom contacts 104 by the one or more bottom spacers 112. Also, the metal gate structure 124 can be electrically isolated from the one or more top S/D regions 122 by the one or more top spacers 114. The one or more top S/D regions 122 can be adjacent to, and/or in contact with, one or more top contacts 126. Example materials that can comprise the one or more top contacts 126 can include: titanium ("Ti"), titanium nitride ("TiN"), tungsten ("W"), a combination thereof, and/or the like.

The one or more bottom contacts 104 can be positioned on one or more S/D regions of the semiconductor substrate 106. Additionally, the one or more bottom contacts 104 can at least partially surround the sidewalls of the base 120 of the semiconductor fin 118. For example, the one or more bottom contacts 104 can be adjacent to, and/or in contact with, a plurality (e.g., all) of the sidewalls of the base 120. In one or more embodiments, the one or more bottom contacts 104 can extend around the entire perimeter of the base 120 of the semiconductor fin 118. As shown in FIG. 1A, the one or more bottom contacts 104 can be located between the S/D region of the semiconductor substrate 106 and the one or more bottom spacers 112, wherein the one or more bottom spacers 112, the one or more insulating layers 110, and/or the semiconductor substrate 106 can encapsulate at least a portion of the one or more bottom contacts 104. Example materials that can comprise the one or more bottom contacts 104 can include: titanium ("Ti"), titanium nitride ("TiN"), tungsten ("W"), a combination thereof, and/or the like. In one or more embodiments, the one or more top contacts 126 and/or the one or more bottom contacts 104 can comprise the same, or substantially the same, composition (e.g., as shown in FIG. 1A).

Advantageously, the one or more bottom contacts 104 can be positioned on the entirety, or substantially the entirety, of the bottom S/D region of the semiconductor substrate 106. Since the one or more bottom contacts 104 can be positioned directly on top of the bottom S/D region, the entire bottom surface of the one or more bottom contacts 104 can be utilized as a shared contact area to facilitate electrical communication between the one or more bottom contacts 104 and the bottom S/D region. As the shared contact are area between the one or more bottom contacts 104 and the bottom S/D region increases, the electrical resistance exhibited by the one or more bottom contacts 104 can decrease.

Figure 1B:
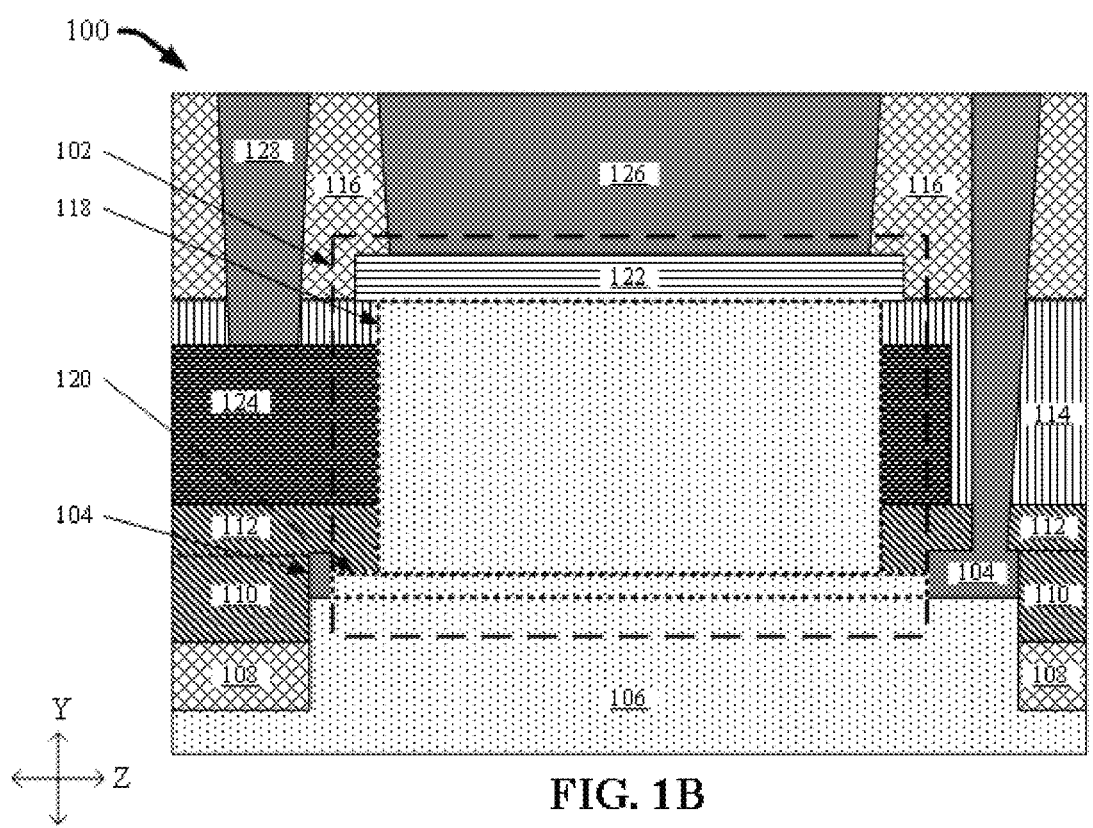
FIG. 1B illustrates a diagram of another example, non-limiting cross-sectional view of a semiconductor device comprising one or more VFETs operably coupled to one or more bottom contacts positioned on a bottom S/D region in accordance with one or more embodiments described herein.

FIG. 1B illustrates a diagram of the example, non-limiting semiconductor device 100 from a second cross-sectional view in accordance with one or more embodiments described herein. Repetitive description of like elements employed in other embodiments described herein is omitted for sake of brevity. Whereas FIG. 1A depicts a cross-sectional view of the semiconductor device 100 along the "Y" and "X" axes; FIG. 1B depicts another cross-sectional view of the semiconductor device 100 along the "Y" and "Z" axes. In other words, the semiconductor device 100 depicted in FIG. 1A can be turned 90 degrees to achieve the cross-sectional view depicted in FIG. 1B.

As shown in FIG. 1B, the semiconductor device 100 can further comprise one or more gate contacts 128 operably coupled to the metal gate structure 124. For example, the one or more gate contacts 128 can be adjacent to, and/or in contact with, the one or more metal gate structures 124. Example materials that can comprise the one or more gate contacts 128 can include: titanium nitride ("TiN"), tungsten ("W"), a combination thereof, and/or the like. In one or more embodiments, the one or more gate contacts 128, the one or more top contacts 126 and/or the one or more bottom contacts 104 can comprise the same, or substantially the same, composition (e.g., as shown in FIG. 1B).

FIG. 1B also shows that the one or more bottom contacts 104 can extend around the base 120 of the semiconductor fin 118 to a backside of the one or more VFET devices 102. For example, FIG. 1B can depict a back portion of the one or more bottom contacts 104 located at a backside of the one or more VFET devices 102 (e.g., the portion of the one or more bottom contacts 104 depicted on the left side of FIG. 1B) and/or a front portion of the one or more bottom contacts 104 located at a frontside of the one or more VFET devices 102 (e.g., the portion of the one or more bottom contacts 104 depicted on the right side of FIG. 1B), wherein the back portion and the front portion of the one or more bottom contacts 104 can be connected. For instance, the back portion and the front portion of the one or more bottom contacts 104 can be connected by one or more side portions (not shown) of the one or more bottom contacts 104 that can extend along the "Z" axis (e.g., between the one or more VFET devices 102 and/or alongside one or more of the VFET devices 102). Additionally, as shown in FIG. 1B, the front portion of the one or more bottom contacts 104 can extend vertically (e.g., along the "Y" axis) through the one or more bottom spacers 112, the one or more top spacers 114, and/or the one or more second ILD layers 116.

At least because the one or more bottom contacts 104 can extend around the one or more bases 120 of the one or more semiconductor fins 118, the one or more bottom contacts 104 can increase the amount of surface contact between: the surfaces of the one or more bottom contacts 104 and the base 120 of the semiconductor fin 118; and/or the surfaces of the one or more bottom contacts 104 and the bottom S/D region of the semiconductor substrate 106 (e.g., a doped region of the semiconductor substrate 106). In other words, the one or more bottom contacts 104 can increase shared contact with one or more semiconductor fins 118 and/or the bottom S/D region of the one or more VFET devices 102 (e.g., as compared to conventional semiconductor architectures) by surrounding (e.g., or at least partially surrounding) the one or more bases 120 of the one or more semiconductor fins 118 while being positioned directly on the bottom S/D region operably coupled to the one or more VFET devices 102.

Figure 2A:
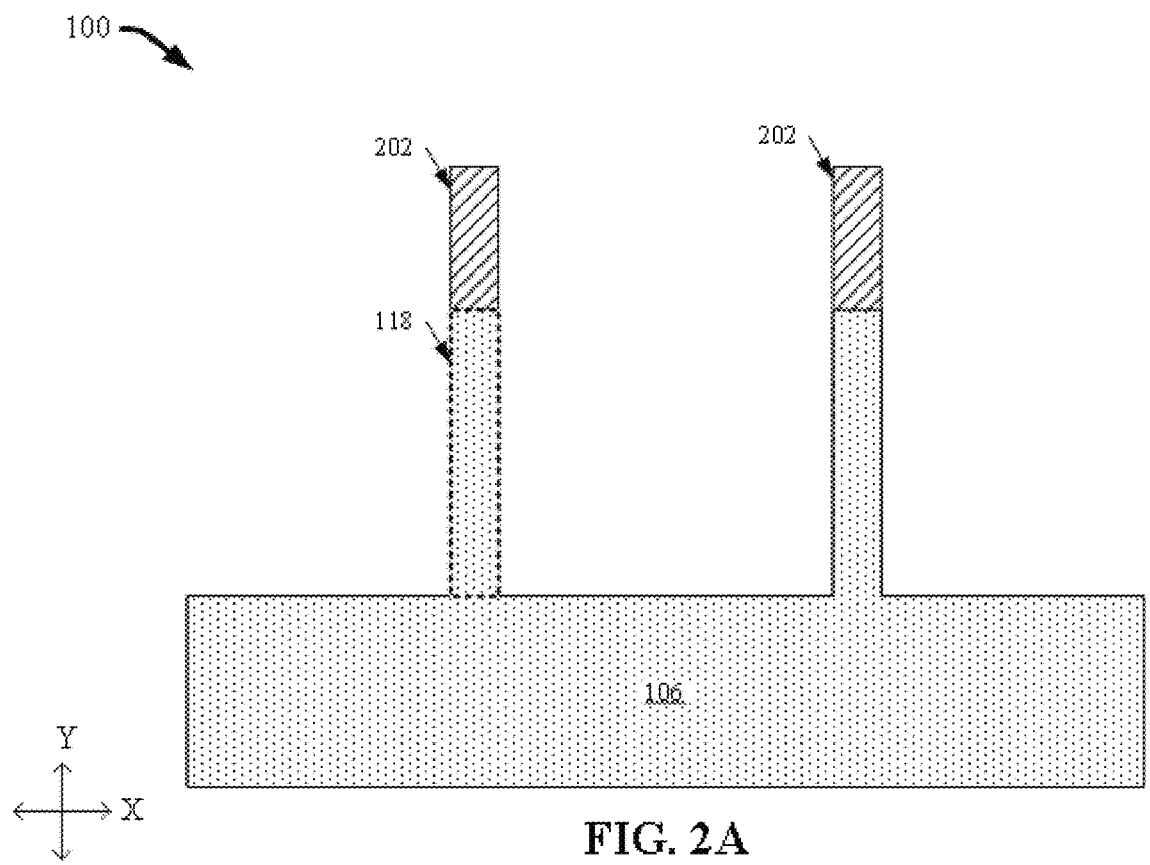
FIG. 2A illustrates a diagram of an example, non-limiting cross-sectional view of a semiconductor device during a first stage of manufacturing in accordance with one or more embodiments described herein.

FIG. 2A illustrates a diagram of the example, non-limiting semiconductor device 100 from the first cross-sectional view during a first stage of manufacturing in accordance with one or more embodiments described herein. Repetitive description of like elements employed in other embodiments described herein is omitted for sake of brevity. During the first stage of manufacturing, the one or more semiconductor fins 118 can be etched from the semiconductor substrate 106. For example, one or more first hard mask layers 202 can be deposited onto the semiconductor substrate 106 to define the positions and/or dimensions of the one or more semiconductor fins 118. Example materials that can comprise the one or more first hard mask layers 202 can include, but are not limited to: silicon dioxide ("SiO$_2$"), silicon nitride ("SiN"), a combination thereof, and/or the like. Additionally, example deposition processes that can facilitate deposition of the one or more first hard mask layers 202 can include, but are not limited to: atomic layer deposition ("ALD"), chemical vapor deposition ("CVD") (e.g., high density plasma ("HPD") CVD), physical vapor deposition ("PVD"), a combination thereof, and/or the like. Subsequently, the portions of the semiconductor substrate 106 not protected by the one or more first hard mask layers 202 can be subjected to one or more etching processes to form the one or more semiconductor fins 118. Example etching processes that can facilitate formation of the one or more semiconductor fins 118 can include, but are not limited to: reactive-ion etching ("RIE"), wet etching, dry etching, plasma etching, sputter etching, a combination thereof, and/or the like.

Figure 2B:
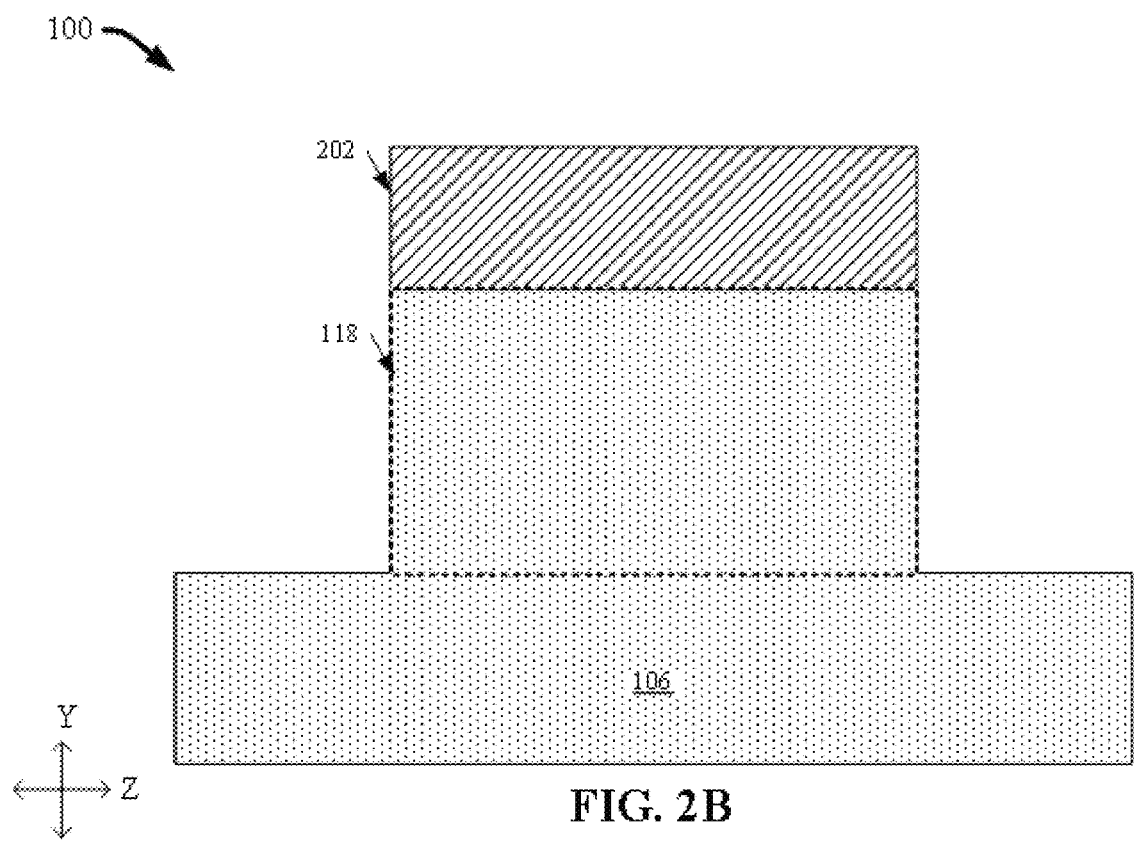
FIG. 2B illustrates a diagram of another example, non-limiting cross-sectional view of a semiconductor device during the first stage of manufacturing in accordance with one or more embodiments described herein.

FIG. 2B illustrates a diagram of the example, non-limiting semiconductor device 100 from the second cross-sectional view during the first stage of manufacturing in accordance with one or more embodiments described herein. Repetitive description of like elements employed in other embodiments described herein is omitted for sake of brevity. As shown in FIG. 2B the one or more etching processes during the first stage of manufacturing can define the location of the one or more semiconductor fins 118 along the "Z" axis as well as the "X" axis.

Figure 3:
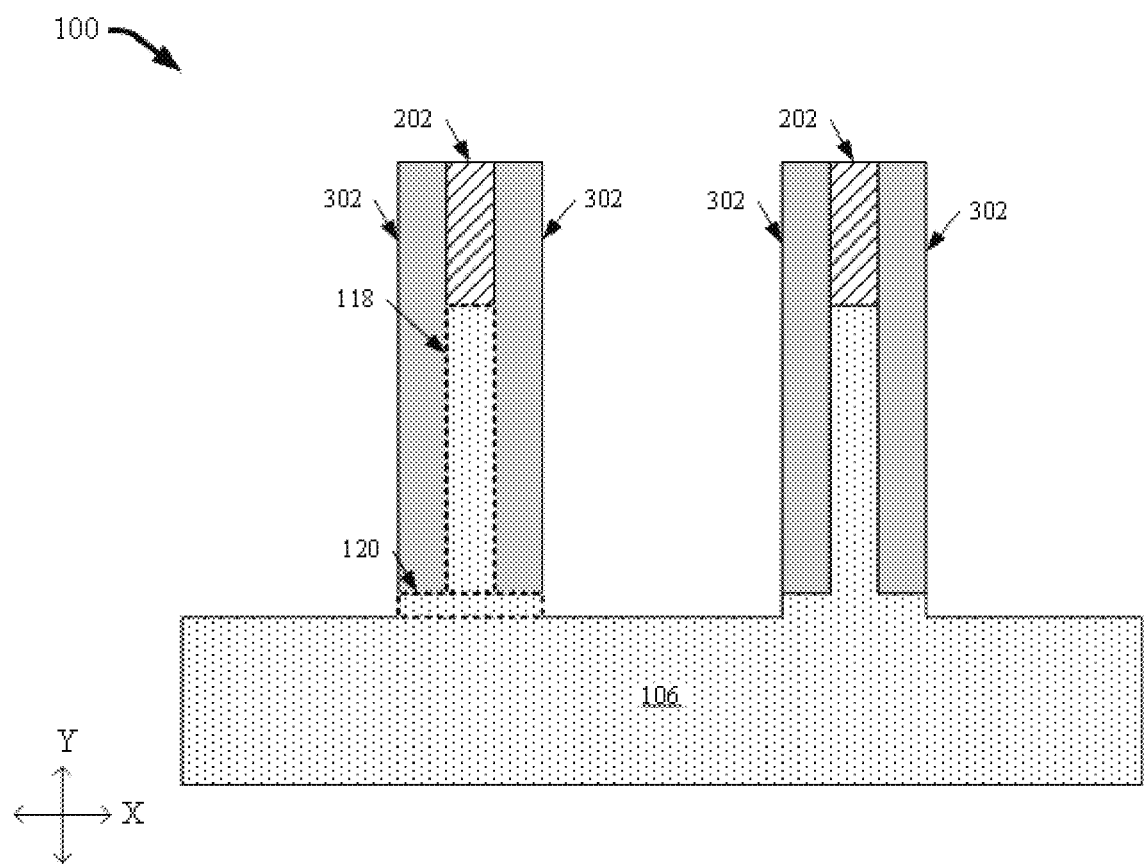
FIG. 3 illustrates a diagram of an example, non-limiting cross-sectional view of a semiconductor device during a second stage of manufacturing in accordance with one or more embodiments described herein.

FIG. 3 illustrates a diagram of the example, non-limiting semiconductor device 100 from the first cross-sectional view during a second stage of manufacturing in accordance with one or more embodiments described herein. Repetitive description of like elements employed in other embodiments described herein is omitted for sake of brevity. During the second stage of manufacturing, the one or more bases 120 of the one or more semiconductor fins 118 can be formed.

As shown in FIG. 3, one or more liner layers 302 can be deposited adjacent to the sidewalls of the one or more semiconductor fins 118. Example materials that can comprise the one or more liner layers 302 can include, but are not limited to: silicon nitride ("SiN"), silicon dioxide ("SiO$_2$"), a combination thereof, and/or the like. Example deposition methods that can facilitate formation of the one or more liner layers 302 can include, but are not limited to: ALD, CVD (e.g., HPD CVD), PVD, a combination thereof, and/or the like. The one or more liner layers 302 can extend the entire length of the one or more semiconductor fins 118.

Further, portions of the semiconductor substrate 106 not protected by the one or more first hard mask layers 202 and/or liner layers 302 can be subjected to one or more additional etching processes. For example, the one or more additional etching processes can define the one or more bases 120 of the one or more semiconductor fins 118 by removing exposed semiconductor material surrounding the one or more liner layers 302. Example etching processes that can facilitate formation of the one or more bases 120 of the one or more semiconductor fins 118 can include, but are not limited to: RIE, wet etching, dry etching, plasma etching, sputter etching, a combination thereof, and/or the like.

Additionally, the one or more liner layers 302 can be deposited alongside the front and/or back sidewalls of the one or more semiconductor fins 118 in addition to the left and/or right sidewalls of the one or more semiconductor fins 118 depicted in FIG. 3. Thus, the base 120 of the one or more semiconductor fins 118 can be formed around the entire perimeter of the of the one or more semiconductor fins 118.

Figure 4A:
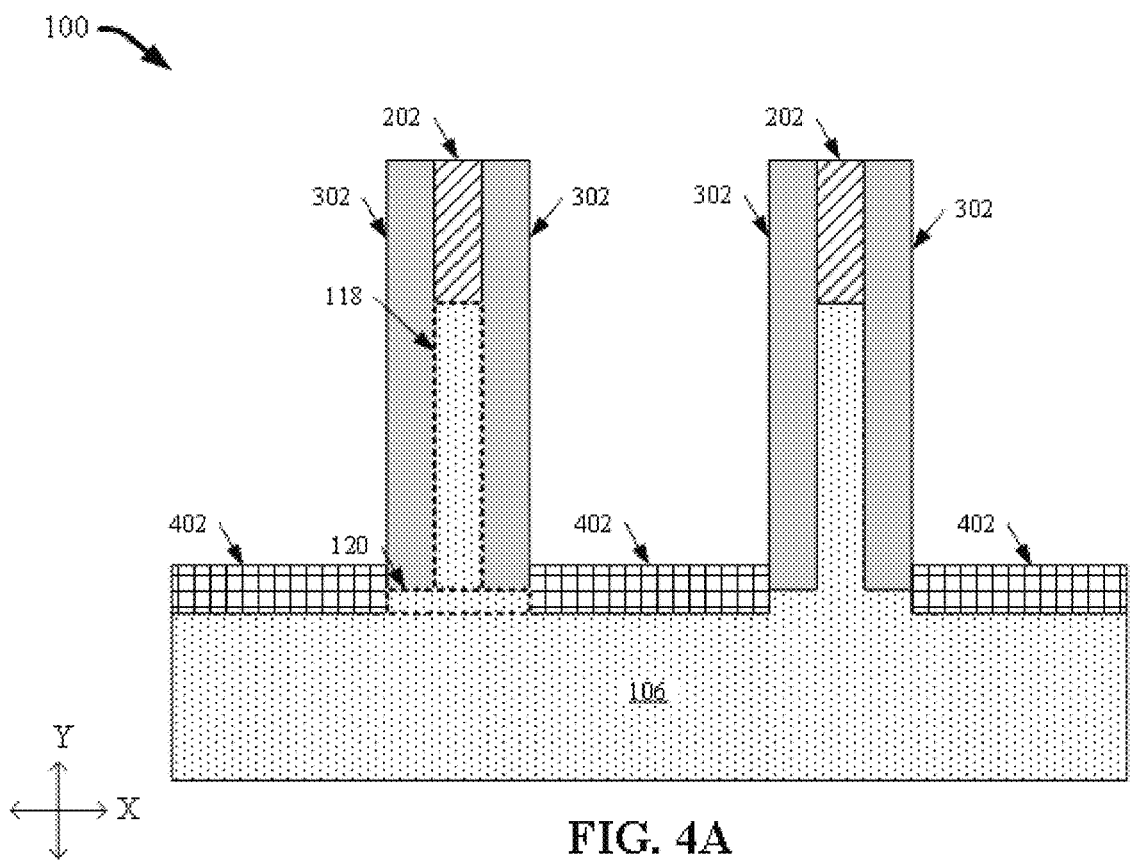
FIG. 4A illustrates a diagram of an example, non-limiting cross-sectional view of a semiconductor device during a third stage of manufacturing in accordance with one or more embodiments described herein.

FIG. 4A illustrates a diagram of the example, non-limiting semiconductor device 100 from the first cross-sectional view during a third stage of manufacturing in accordance with one or more embodiments described herein. Repetitive description of like elements employed in other embodiments described herein is omitted for sake of brevity. During the third stage of manufacturing, one or more sacrificial layers 402 can be deposited onto the semiconductor substrate 106. The one or more sacrificial layers 402 can comprise one or more dielectric materials. Example dielectric materials that can comprise the one or more sacrificial layers 402 can include, but are not limited to: silicon dioxide, silicon germanium ("SiGe"), a combination thereof, and/or the like. Example deposition processes that can facilitate depositing the one or more sacrificial layers 402 can include, but are not limited to: ALD, CVD (e.g., HPD CVD), PVD, a combination thereof, and/or the like. For instance, one or more HPD CVD processes can be utilized during the third stage of manufacturing to directionally deposit the one or more sacrificial layers 402. In one or more embodiments, deposition of the one or more sacrificial layers 402 can also be facilitated by one or more isotropic etch back processes.

As shown in FIG. 4A, the one or more sacrificial layers 402 can be deposited onto the semiconductor substrate 106 and/or adjacent to the one or more bases 120 of the one or more semiconductor fins 118. In one or more embodiments, the one or more sacrificial layers 402 can at least partially surround the one or more bases 120. For example, the one or more sacrificial layers 402 can be adjacent to, and/or in contact with, a plurality of sidewalls of the one or more bases 120 of the one or more semiconductor fins 118. The one or more sacrificial layers 402 can have an exemplary thickness (e.g., along the "Y" axis) greater than or equal to 5 nanometers (nm) and less than or equal to 20 nm. In one or more embodiments, the one or more sacrificial layers 402 can have a thickness (e.g., along the "Y" axis) equal to, or substantially equal to, the thickness (e.g., along the "Y" axis) of the one or more bases 120 of the one or more semiconductor fins 118.

Figure 4B:
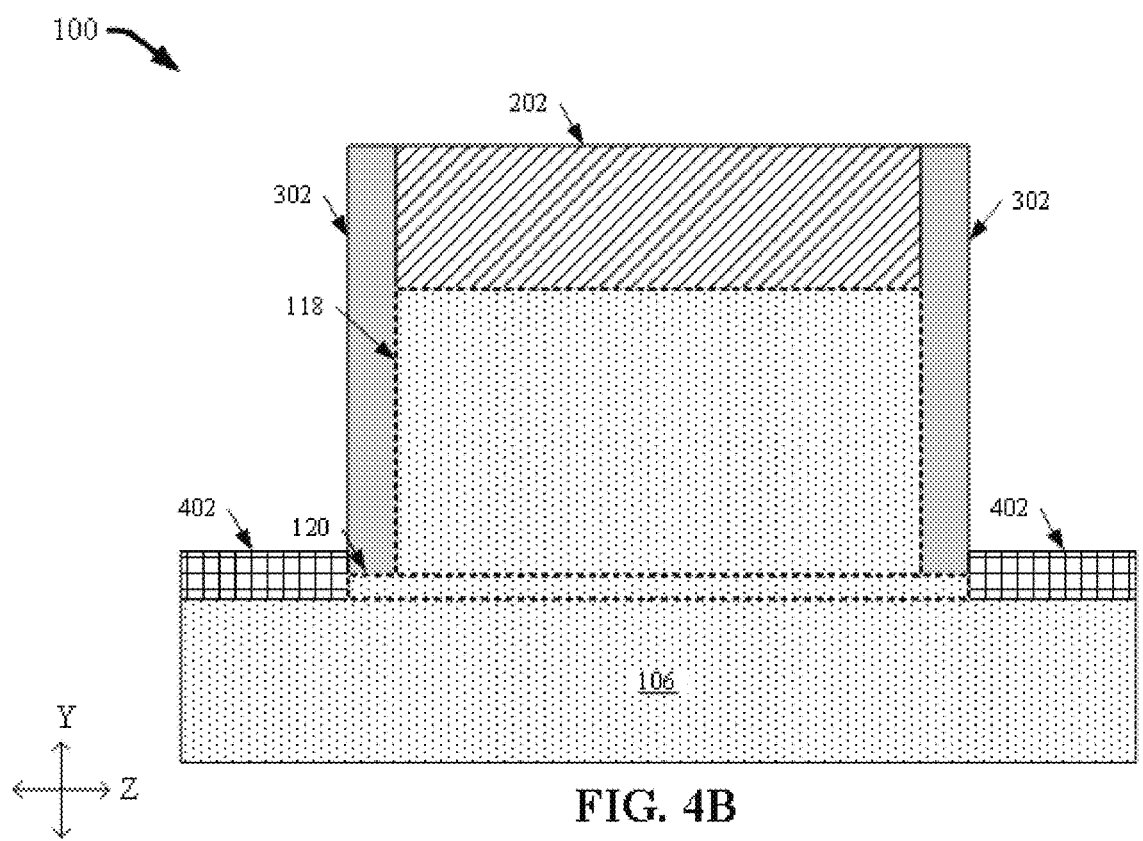
FIG. 4B illustrates a diagram of another example, non-limiting cross-sectional view of a semiconductor device during the third stage of manufacturing in accordance with one or more embodiments described herein.

FIG. 4B illustrates a diagram of the example, non-limiting semiconductor device 100 from the second cross-sectional view during the third stage of manufacturing in accordance with one or more embodiments described herein. Repetitive description of like elements employed in other embodiments described herein is omitted for sake of brevity. As shown in FIG. 4B, the one or more sacrificial layers 402 can be deposited alongside the front and/or back sidewalls of the one or more bases 120 of the one or more semiconductor fins 118 in addition to the left and/or right sidewalls of the one or more bases 120 of the one or more semiconductor fins 118 depicted in FIG. 4A. Thus, the one or more sacrificial layers 402 can be formed around the entire perimeter of the of the one or more bases 120.

Figure 5A:
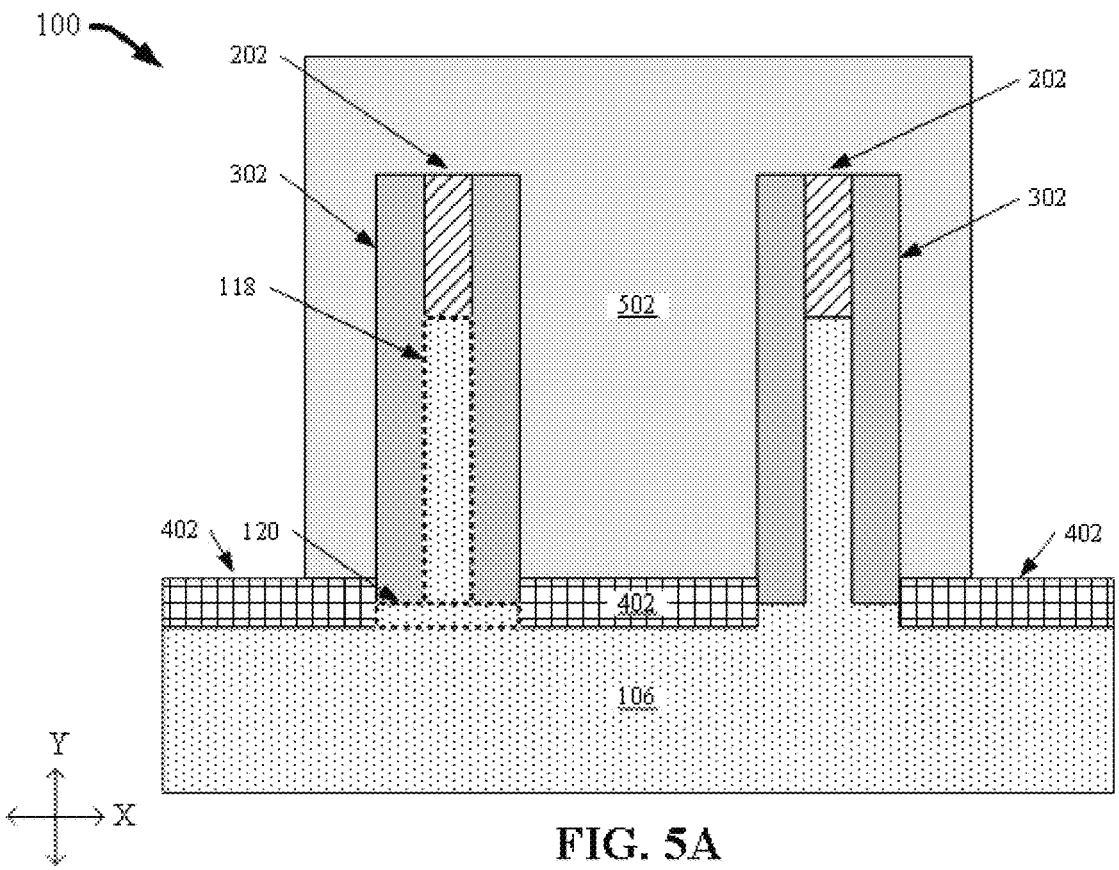
FIG. 5A illustrates a diagram of an example, non-limiting cross-sectional view of a semiconductor device during a fourth stage of manufacturing in accordance with one or more embodiments described herein.

FIG. 5A illustrates a diagram of the example, non-limiting semiconductor device 100 from the first cross-sectional view during a fourth stage of manufacturing in accordance with one or more embodiments described herein. Repetitive description of like elements employed in other embodiments described herein is omitted for sake of brevity. During the fourth stage of manufacturing, one or more second hard mask layers 502 can deposited over the one or more semiconductor fins 118 and/or portions of the one or more sacrificial layers 402.

For example, one or more lithography processes can be utilized to pattern the one or more second hard mask layers 502 to select positions (e.g., as shown in FIG. 5A). The one or more second hard mask layers 502 can comprise materials that can be selectively removed from one or more sacrificial layers 402 and/or the one or more bottom spacers 112 (e.g., selectively removed from silicon dioxide and/or silicon nitride). Example materials that can comprise the one or more second hard mask layers 502 can include, but are not limited to: silicon dioxide ("SiO$_2$"), amorphous silicon ("Si"), a combination thereof, and/or the like. In one or more embodiments, the one or more second hard mask layers 502 can comprise a composition different than the one or more first hard mask layers 202.

As shown in FIG. 5A, the one or more second hard mask layers 502 can be deposited onto the one or more first hard mask layers 202, the one or more liner layers 302, and/or portions of the one or more sacrificial layers 402. Example deposition processes that can facilitate depositing the one or more second hard mask layers 502 can include, but are not limited to: ALD, CVD (e.g., HPD CVD), PVD, a combination thereof, and/or the like.

Figure 5B:
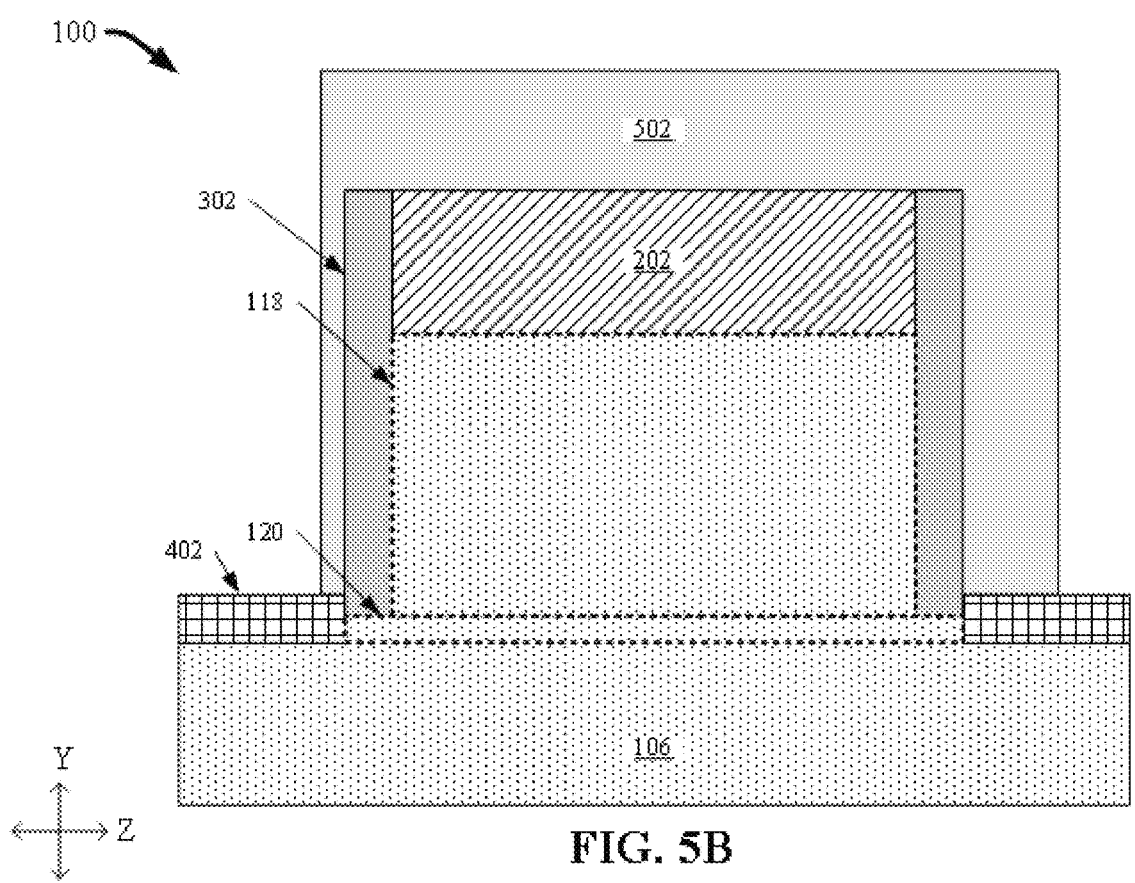
FIG. 5B illustrates a diagram of another example, non-limiting cross-sectional view of a semiconductor device during the fourth stage of manufacturing in accordance with one or more embodiments described herein.

FIG. 5B illustrates a diagram of the example, non-limiting semiconductor device 100 from the second cross-sectional view during the fourth stage of manufacturing in accordance with one or more embodiments described herein. Repetitive description of like elements employed in other embodiments described herein is omitted for sake of brevity. As shown in FIG. 5B, the one or more second hard mask layers 502 can be deposited along the "Z" axis of the semiconductor device 100 in addition to the "X" axis depicted in FIG. 5A. Also, in one or more embodiments, the one or more second hard mask layers 502 can be further from the one or more liner layers 302 at the front portion of the semiconductor device 100 (e.g., the right portion shown in FIG. 5B) than the one or more liner layers 302 at the back portion of the semiconductor device 100 (e.g., the left portion shown in FIG. 5B).

Figure 6:
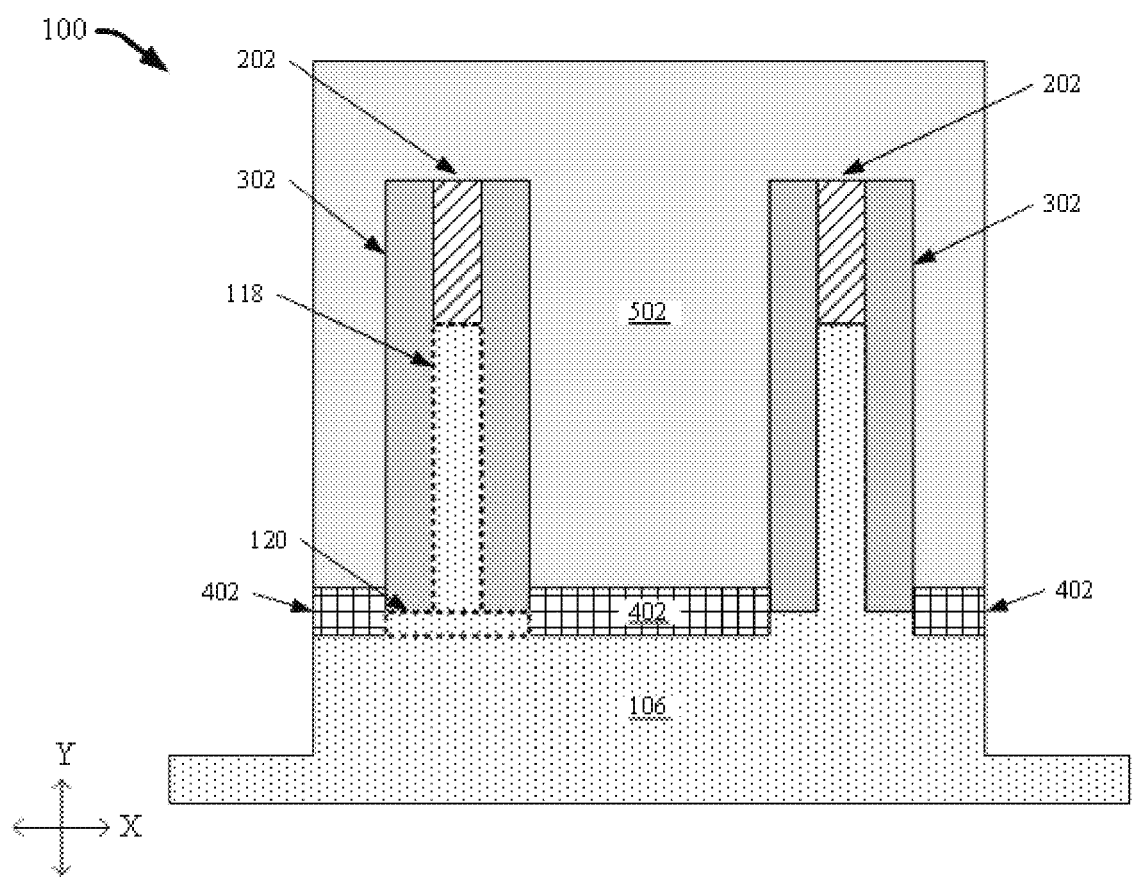
FIG. 6 illustrates a diagram of an example, non-limiting cross-sectional view of a semiconductor device during a fifth stage of manufacturing in accordance with one or more embodiments described herein.

FIG. 6 illustrates a diagram of the example, non-limiting semiconductor device 100 from the first cross-sectional view during a fifth stage of manufacturing in accordance with one or more embodiments described herein. Repetitive description of like elements employed in other embodiments described herein is omitted for sake of brevity. During the fifth stage of manufacturing, portions of the one or more sacrificial layers 402 and/or semiconductor substrate 106 not protected by the one or more second hard mask layers 502 can be subjected to one or more further etching processes. In one or more embodiments, the one or more etching processes of the fifth stage of manufacturing can form one or more trenches for shallow trench isolation.

As shown in FIG. 6, portions of the semiconductor device 100 not covered by the one or more second hard mask layers 502 can be further etched during the fifth stage of manufacturing to define one or more regions of the semiconductor substrate 106 that can serve as a bottom S/D region for the one or more VFET devices 102. For example, the one or more defined regions can be doped. Example etching processes that can be utilized in the fifth stage of manufacturing can include, but are not limited to: RIE, wet etching, dry etching, plasma etching, sputter etching, a combination thereof, and/or the like. Also, the etching processes during the fifth stage of manufacturing can define the location of the one or more regions in the semiconductor substrate 106 along the "Z" axis as well as the "X" axis.

Figure 7:
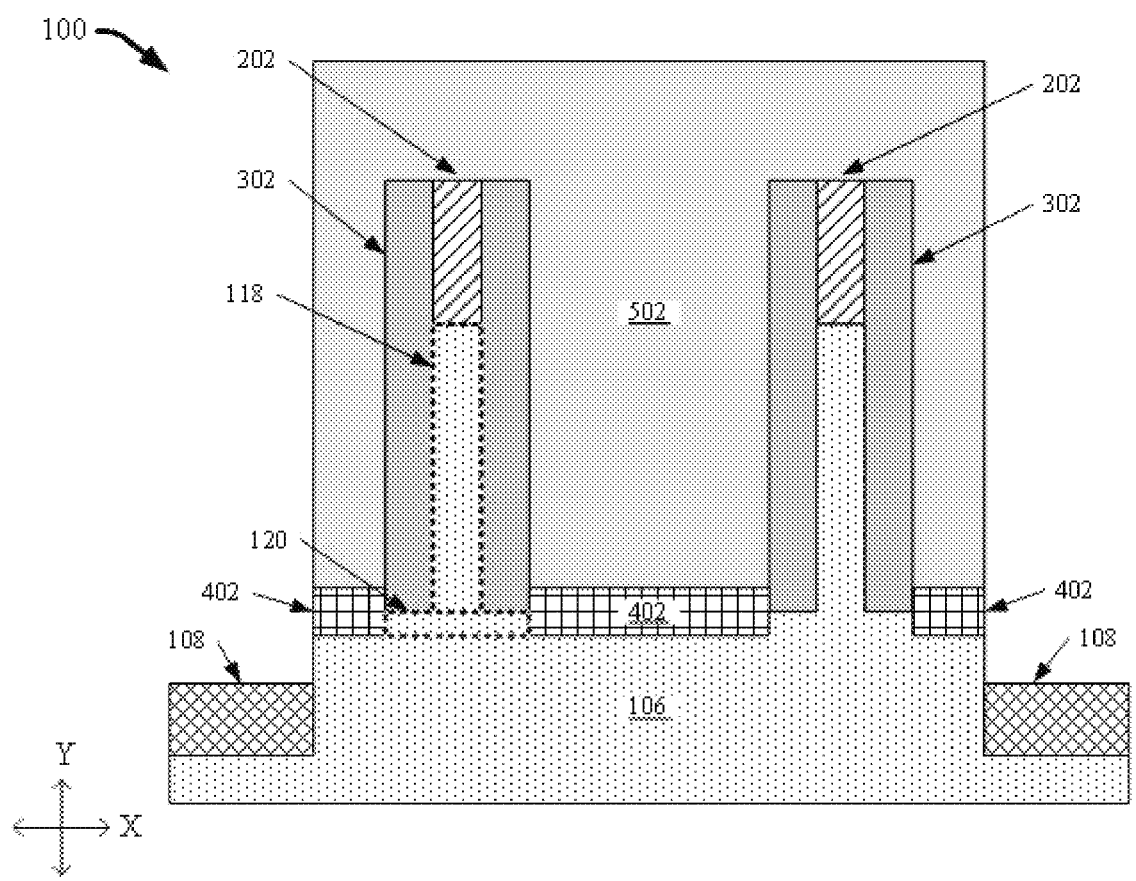
FIG. 7 illustrates a diagram of an example, non-limiting cross-sectional view of a semiconductor device during a sixth stage of manufacturing in accordance with one or more embodiments described herein.

FIG. 7 illustrates a diagram of the example, non-limiting semiconductor device 100 from the first cross-sectional view during a sixth stage of manufacturing in accordance with one or more embodiments described herein. Repetitive description of like elements employed in other embodiments described herein is omitted for sake of brevity. During the sixth stage of manufacturing, the one or more first ILD layers 108 can be deposited onto the semiconductor substrate 106. As shown in FIG. 7, the one or more first ILD layers 108 can be deposited onto portions of the semiconductor substrate 106 that were etched during the fifth stage of manufacturing and/or are not protected by the one or more second hard mask layers 502. For example, the one or more first ILD layers 108 can be deposited adjacent to one or more portions of the semiconductor substrate 106 that can serve as a bottom S/D region for the one or more VFET devices 102.

Example deposition processes that can facilitate depositing the one or more first ILD layers 108 can include, but are not limited to: ALD, CVD (e.g., HPD CVD), PVD, a combination thereof, and/or the like. For instance, the one or more first ILD layers 108 can be deposited into the one or more trenches formed by the etching during the fifth stage of manufacturing, and then the one or more first ILD layers 108 can be etched back to a height (e.g., along the "Y" axis) below the one or more sacrificial layers 402 (e.g., as shown in FIG. 7). Also, the one or more first ILD layers 108 can be deposited into one or more trenches formed along the front side and/or back side of the semiconductor device 100.

Figure 8:
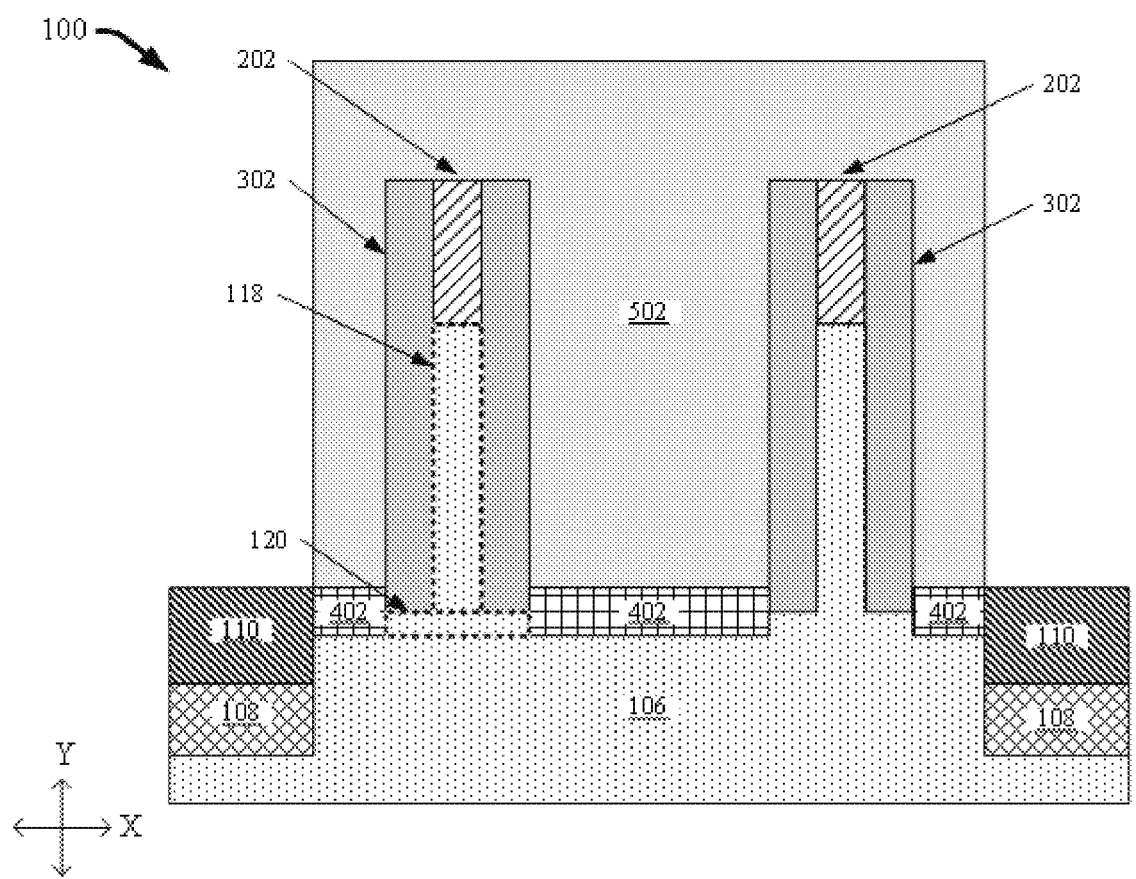
FIG. 8 illustrates a diagram of an example, non-limiting cross-sectional view of a semiconductor device during a seventh stage of manufacturing in accordance with one or more embodiments described herein.

FIG. 8 illustrates a diagram of the example, non-limiting semiconductor device 100 from the first cross-sectional view during a seventh stage of manufacturing in accordance with one or more embodiments described herein. Repetitive description of like elements employed in other embodiments described herein is omitted for sake of brevity. During the seventh stage of manufacturing, the one or more insulating layers 110 can be deposited onto the one or more first ILD layers 108.

Example deposition processes that can facilitate depositing the one or more insulating layers 110 can include, but are not limited to: ALD, CVD (e.g., HPD CVD), PVD, a combination thereof, and/or the like. For instance, the one or more insulating layers 110 can be directionally deposited by one or more CVD processes and then etched back to a height (e.g., along the "Y" axis) greater than or equal to the height (e.g., along the "Y" axis) of the one or more sacrificial layers 402. For example, FIG. 8 depicts the one or more insulating layers 110 etched back to a height equal to the height of the one or more sacrificial layers 402. Since the one or more insulating layers 110 can extend from a position below the one or more sacrificial layers 402 (e.g., along the "Y" axis), the one or more insulating layers 110 can have a thickness greater than the thickness of the one or more sacrificial layers 402 to facilitate achieving a height greater than or equal to one or more sacrificial layers 402. As shown in FIG. 8, at least a portion of the one or more insulating layers 110 can be adjacent to, and/or in contact with, a portion of the one or more sacrificial layers 402. Also, the one or more insulating layers 110 can be deposited onto the one or more first ILD layers 108 and/or adjacent to the one or more sacrificial layers 402 along the front side and/or back side of the semiconductor device 100.

Figure 9:
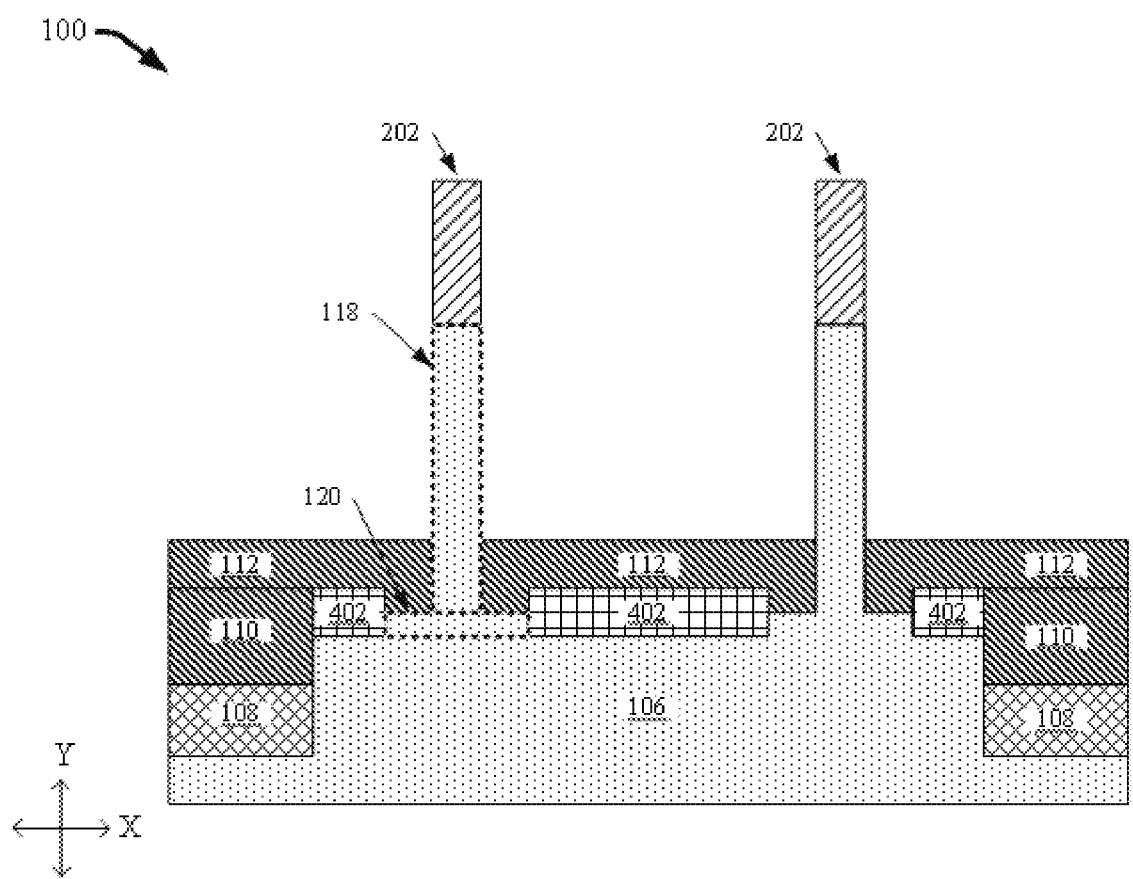
FIG. 9 illustrates a diagram of an example, non-limiting cross-sectional view of a semiconductor device during an eighth stage of manufacturing in accordance with one or more embodiments described herein.

FIG. 9 illustrates a diagram of the example, non-limiting semiconductor device 100 from the first cross-sectional view during an eighth stage of manufacturing in accordance with one or more embodiments described herein. Repetitive description of like elements employed in other embodiments described herein is omitted for sake of brevity. During the eighth stage of manufacturing, the one or more second hard mask layers 502 and/or the one or more liner layers 302 can be removed (e.g., by one or more etching processes). Example etching processes that can facilitate removal of the one or more second hard mask layers 502 and/or the one or more liner layer 302 can include, but are not limited to: RIE, wet etching, dry etching, plasma etching, sputter etching, a combination thereof, and/or the like.

Additionally, the eighth stage of manufacturing can comprise depositing the one or more bottom spacers 112 onto the one or more insulating layers 110, the one or more sacrificial layers 402, and/or the one or more bases 120 of the one or more semiconductor fins 118. Example deposition processes that can facilitate depositing the one or more bottom spacers 112 can include, but are not limited to: ALD, CVD (e.g., HPD CVD), PVD, a combination thereof, and/or the like. As shown in FIG. 9, depositing the one or more bottom spacers 112 can seal the one or more sacrificial layers 402. For example, the one or more sacrificial layers 402 can be encapsulated by the one or more bottom spacers 112 and/or the semiconductor substrate 106. Additionally, in one or more embodiments the one or more bottom spacers 112 and/or the one or more insulting layers 110 can comprise the same, or substantially same, composition. For instance, the one or more bottom spacers 112 and/or the one or more insulating layers 110 can both comprise silicon nitride, thereby the one or more sacrificial layers 402 can be encapsulated by the silicon nitride and the semiconductor substrate 106 (e.g., the one or more bases 120 and/or the one or more bottom S/D regions). Also, the one or more bottom spacers 112 can be deposited onto the one or more insulating layers 110, the one or more sacrificial layers 402, and/or the one or more bases 120 along the front side and/or back side of the semiconductor device 100.

Figure 10:
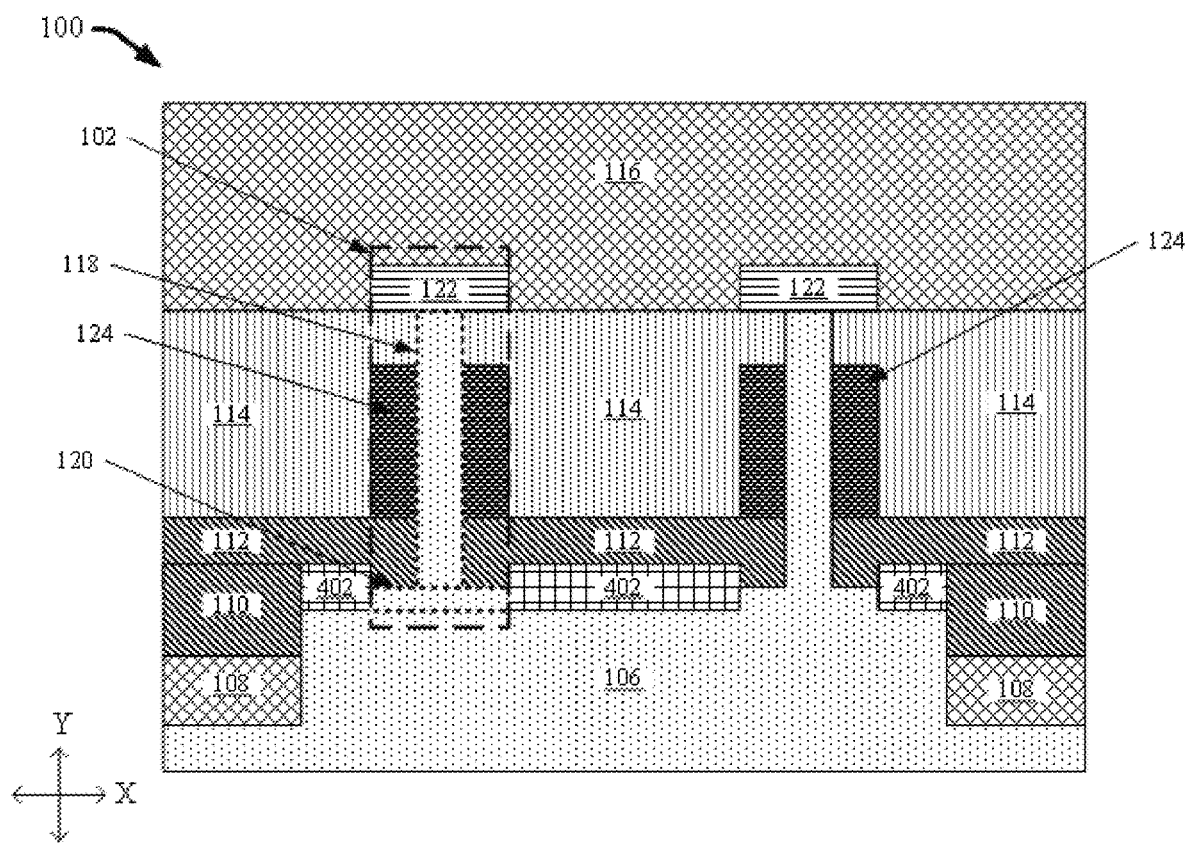
FIG. 10 illustrates a diagram of an example, non-limiting cross-sectional view of a semiconductor device during a ninth stage of manufacturing in accordance with one or more embodiments described herein.

FIG. 10 illustrates a diagram of the example, non-limiting semiconductor device 100 from the first cross-sectional view during a ninth stage of manufacturing in accordance with one or more embodiments described herein. Repetitive description of like elements employed in other embodiments described herein is omitted for sake of brevity. During the ninth stage of manufacturing the one or more metal gate structures 124 can be deposited onto the one or more bottom spacers 112 and/or adjacent to the one or more semiconductor fins 118. For example, the one or more metal gate structures 124 can be adjacent to, and/or in contact with, a center portion of the one or more semiconductor fins 118 (e.g., as shown in FIG. 10). Example deposition processes that can facilitate depositing the one or more metal gate structures 124 can include, but are not limited to: ALD, CVD (e.g., HPD CVD), PVD, a combination thereof, and/or the like.

Further, during the ninth stage of manufacturing the one or more top spacers 114 can be deposited onto the one or more metal gate structures 124 and/or the one or more bottom spacers 112. Example deposition processes that can facilitate depositing the one or more top spacers 114 can include, but are not limited to: ALD, CVD (e.g., HPD CVD), PVD, a combination thereof, and/or the like. In one or more embodiments, the one or more first hard mask layers 202 can be removed (e.g., by one or more etching processes) after deposition of the one or more top spacers 114 and/or metal gate structures 124. Example etching processes that can facilitate removal of the one or more first hard mask layers 202 can include, but are not limited to: RIE, wet etching, dry etching, plasma etching, sputter etching, a combination thereof, and/or the like.

Figure 11A:
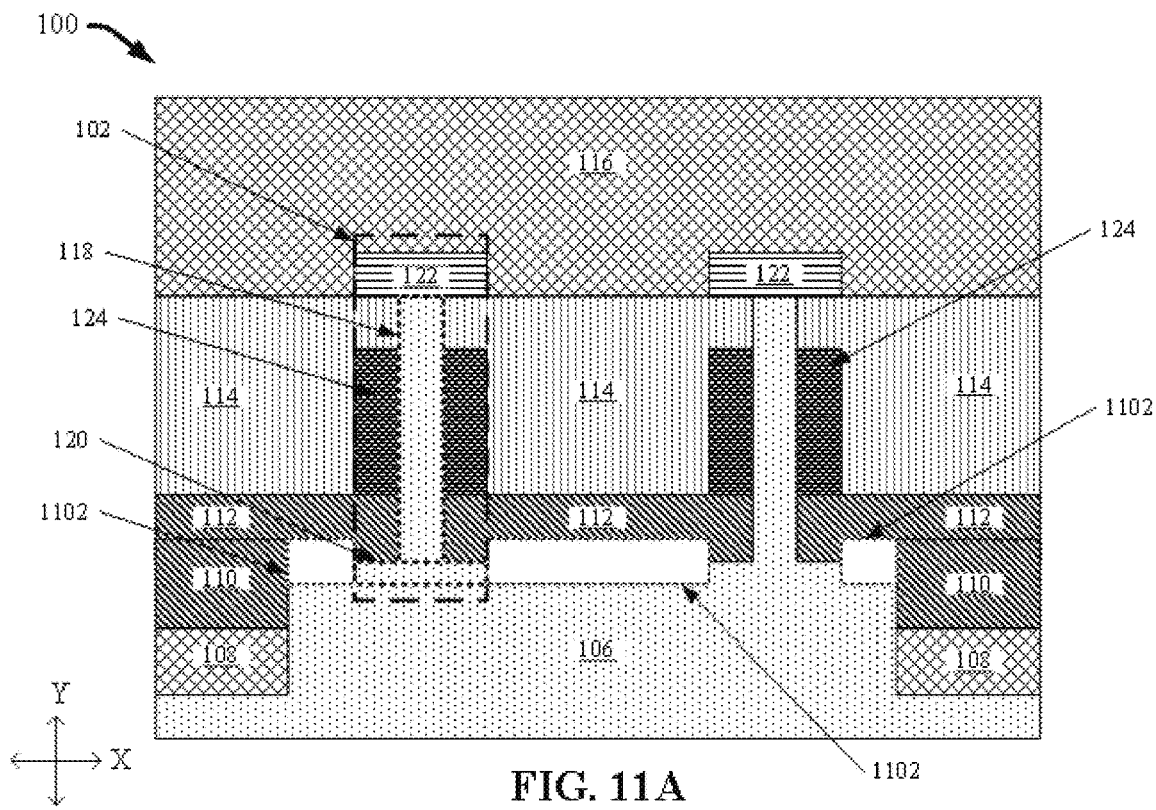
FIG. 11A illustrates a diagram of an example, non-limiting cross-sectional view of a semiconductor device during a tenth stage of manufacturing in accordance with one or more embodiments described herein.

Additionally, the one or more top S/D regions 122 can be deposited onto the distal ends of the one or more semiconductor fins 118 subsequent to the removal of the one or more first hard mask layers 202. Moreover, the one or more second ILD layers 116 can be deposited onto the one or more top S/D regions 122. Example deposition processes that can facilitate depositing the one or more top S/D regions 122 and/or second ILD layers 116 can include, but are not limited to: ALD, CVD (e.g., HPD CVD), PVD, a combination thereof, and/or the like. Thus, formation of the one or more VFET devices 102 can be completed during the ninth stage of manufacturing. FIG. 11A illustrates a diagram of the example, non-limiting semiconductor device 100 from the first cross-sectional view during a tenth stage of manufacturing in accordance with one or more embodiments described herein. Repetitive description of like elements employed in other embodiments described herein is omitted for sake of brevity. During the tenth stage of manufacturing, the one or more sacrificial layers 402 can be removed (e.g., by one or more etching processes) to form one or more empty cavities 1102 (e.g., delineated by dashed lines in FIG. 11A). For instance, the one or more sacrificial layers 402 can be removed by one or more selective etching processes.

Example etching processes that can facilitate removal of the one or more first hard mask layers 202 can include, but are not limited to: RIE, wet etching, dry etching, plasma etching, sputter etching, a combination thereof, and/or the like.

In one or more embodiments, all, or substantially all, of the one or more sacrificial layers 402 can be removed from the semiconductor device 100 (e.g., as shown in FIG. 11A). Alternatively, in one or more embodiments the one or more sacrificial layers 402 can be partially removed from the semiconductor device 100. For example, one or more select portions of the one or more sacrificial layers 402 can remain in the semiconductor device 100, while other portions of the one or more sacrificial layers 402 can be removed during the tenth stage of manufacturing.

Figure 11B:
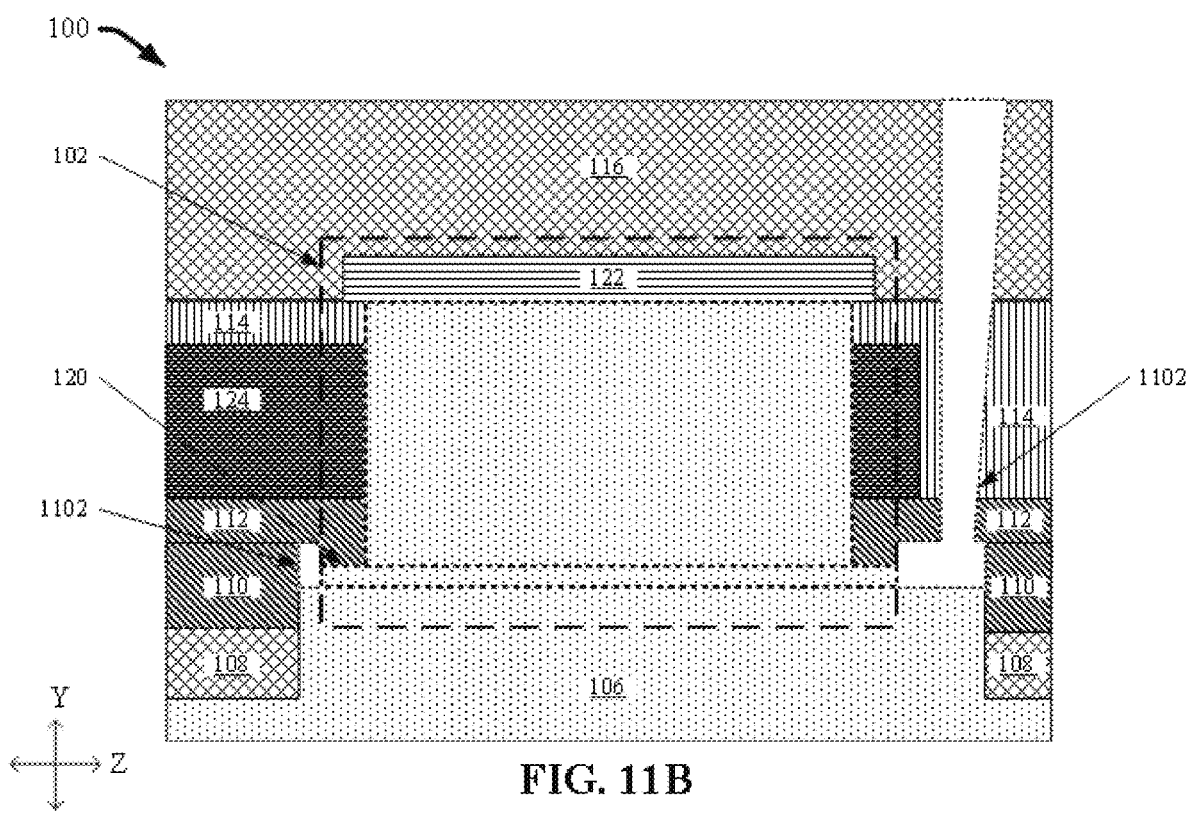
FIG. 11B illustrates a diagram of another example, non-limiting cross-sectional view of a semiconductor device during the tenth stage of manufacturing in accordance with one or more embodiments described herein.

FIG. 11B illustrates a diagram of the example, non-limiting semiconductor device 100 from the second cross-sectional view during the tenth stage of manufacturing in accordance with one or more embodiments described herein. Repetitive description of like elements employed in other embodiments described herein is omitted for sake of brevity. As shown in FIG. 11B, one or more via holes can be formed within the one or more second ILD layers 116, the one or more top spacers 114, and/or the one or more bottom spacers 112 to reach the one or more sacrificial layers 402. For example, the one or more via holes can form a part of the one or more cavities 1102 formed during the tenth stage of manufacturing. In one or more embodiments, the one or more via holes can facilitate removal of the one or more sacrificial layers 402. By forming the one or more via holes and/or removing the one or more sacrificial layers 402, the tenth stage of manufacturing can form one or more cavities 1102 within the semiconductor device 100 that can define the future location of the one or more bottom contacts 104.

Figure 12A:
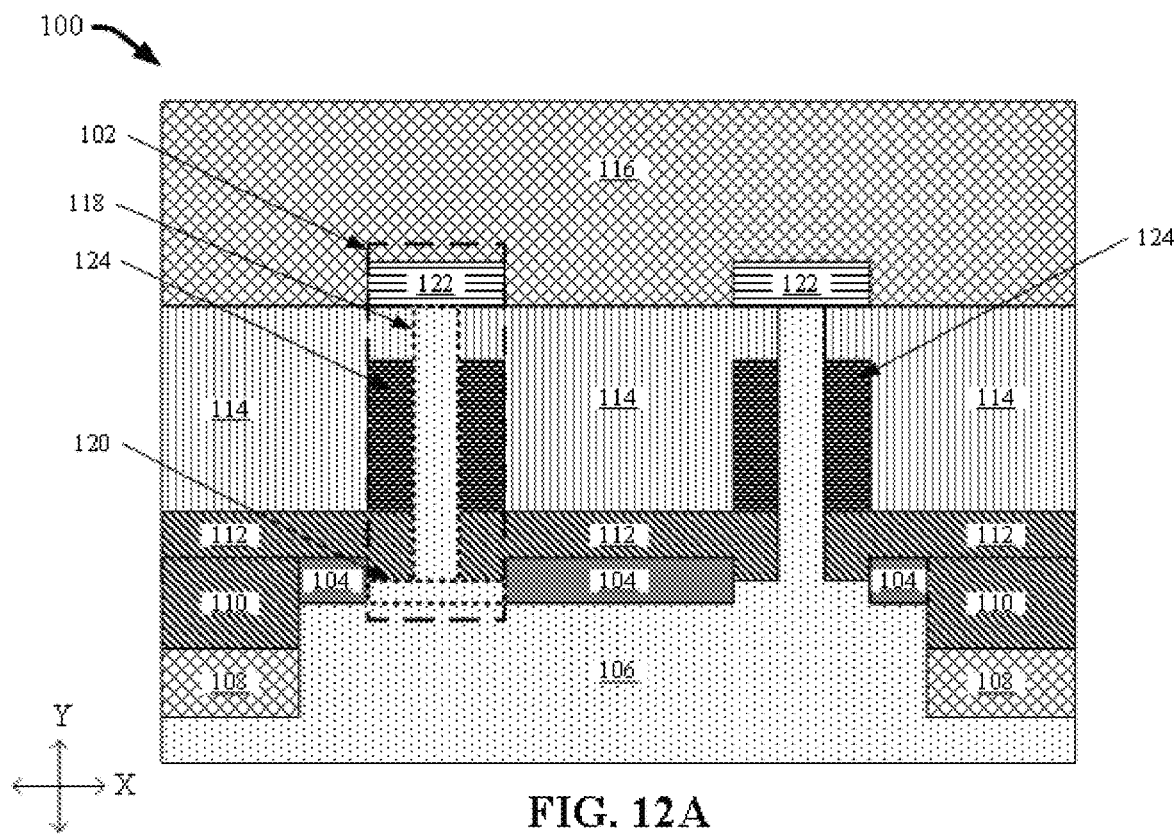
FIG. 12A illustrates a diagram of an example, non-limiting cross-sectional view of a semiconductor device during an eleventh stage of manufacturing in accordance with one or more embodiments described herein.

FIG. 12A illustrates a diagram of the example, non-limiting semiconductor device 100 from the first cross-sectional view during an eleventh stage of manufacturing in accordance with one or more embodiments described herein. Repetitive description of like elements employed in other embodiments described herein is omitted for sake of brevity. During the eleventh stage of manufacturing, the one or more cavities 1102 can be filled to form the one or more bottom contacts 104. As shown in FIG. 12A, the one or more bottom contacts 104 can be deposited into the one or more empty cavities 1102 created by the removal of the one or more sacrificial layers 402. Example deposition processes that can facilitate depositing the one or more bottom contacts 104 can include, but are not limited to: ALD, CVD (e.g., HPD CVD), PVD, a combination thereof, and/or the like.

Figure 12B:
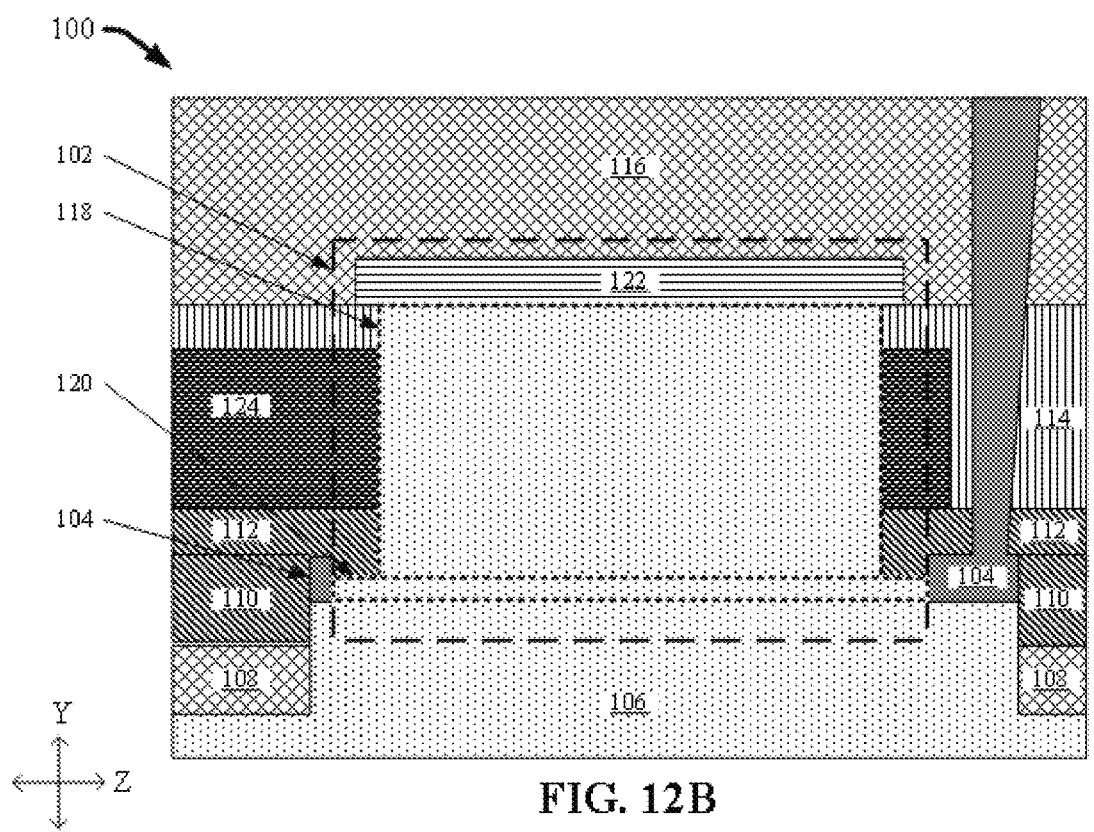
FIG. 12B illustrates a diagram of another example, non-limiting cross-sectional view of a semiconductor device during the eleventh stage of manufacturing in accordance with one or more embodiments described herein.

FIG. 12B illustrates a diagram of the example, non-limiting semiconductor device 100 from the second cross-sectional view during the eleventh stage of manufacturing in accordance with one or more embodiments described herein. Repetitive description of like elements employed in other embodiments described herein is omitted for sake of brevity. As shown in FIG. 12B, the one or more via holes can also be filled to form one or more portions of the one or more bottom contacts 104 that can extend vertically (e.g., along the "Y" axis) through the one or more bottom spacers 112, the one or more top spacers 114, and/or the one or more second ILD layers 116. In one or more embodiments, the one or more bottom contacts 104 can be deposited through the one or more via holes to be positioned within cavities 1102 located on the bottom S/D region and/or around the one or more bases 120.

Further, the top contact 126 can be formed within the one or more second ILD layers 116 to achieve the final structure depicted in FIGS. 1A and 1B. For example, one or more portions of the one or more second ILD layers 116 located adjacent to the one or more top S/D regions 122 can be etched away to facilitate deposition of the one or more top contacts 126. As shown in FIG. 1A, the one or more top contacts 126 can be deposited adjacent to, and/or in contact with, the one or more top S/D regions 122. Example deposition processes that can facilitate depositing the one or more top contacts 126 can include, but are not limited to: ALD, CVD (e.g., HPD CVD), PVD, a combination thereof, and/or the like.

Moreover, the one or more gate contacts 128 can be formed to achieve the final structure depicted in FIGS. 1A and 1B. For example, one or more portions of the one or more second ILD layers 116 and the one or more top spacers 114 located adjacent to the one or more metal gate structures 124 can be etched away to facilitate deposition of the one or more gate contacts 128. As shown in FIG. 1B, the one or more gate contacts 128 can be deposited adjacent to, and/or in contact with, the one or more metal gate structures 124. Example deposition processes that can facilitate depositing the one or more gate contacts 128 can include, but are not limited to: ALD, CVD (e.g., HPD CVD), PVD, a combination thereof, and/or the like.

Figure 13:
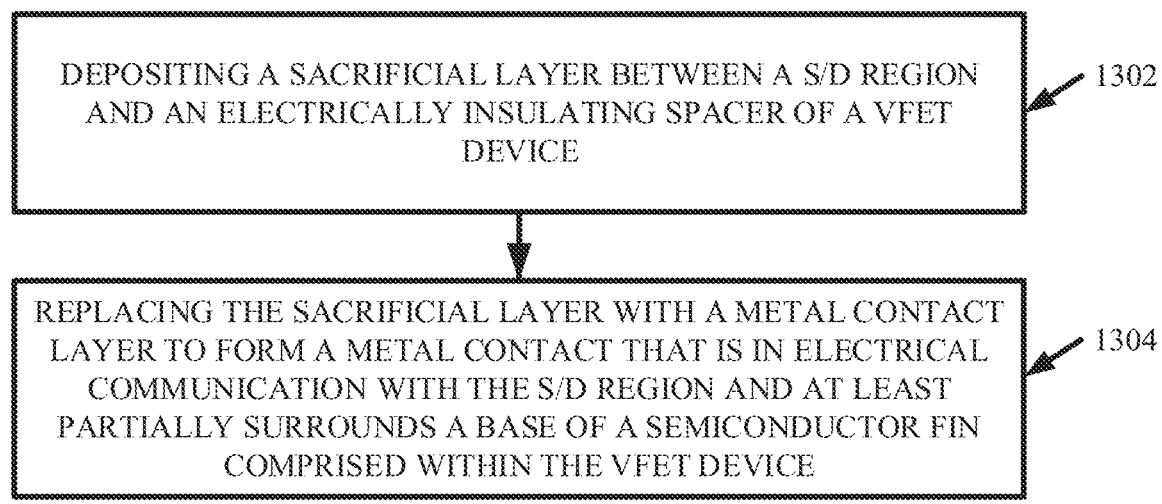
FIG. 13 illustrates a flow diagram of an example, non-limiting method that can facilitate manufacturing of one or more semiconductor devices comprising one or more VFETs operably coupled to one or more bottom contacts with low electrical resistance in accordance with one or more embodiments described herein.

FIG. 13 illustrates a flow diagram of an example, non-limiting method 1300 that can facilitate manufacturing one or more semiconductor devices 100 in accordance with one or more embodiments described herein. Repetitive description of like elements employed in other embodiments described herein is omitted for sake of brevity.

At 1302, the method 1300 can comprise depositing one or more sacrificial layers 402 between one or more S/D regions and one or more electrically insulating spacers (e.g., one or more bottom spacers 112) of one or more VFET devices 102. For example, the depositing at 1302 can be performed in accordance with the third, fourth, fifth, sixth, seventh, eighth, and/or ninth stages of manufacturing described herein. For instance, the one or more sacrificial layers 402 can be deposited onto a semiconductor substrate 106 that can serve as the one or more bottom S/D regions for the one or more VFET devices 102 (e.g., one or more doped regions of the semiconductor substrate 106). The one or more sacrificial layers 402 can be deposited at least partially surrounding the one or more bases 120 of the one or more semiconductor fins 118 that are comprised within the one or more VFET devices 102. For example, FIGS. 4A-10 can illustrate the positioning of the one or more sacrificial layers 402 as a result of the depositing at 1302. Example deposition processes that can facilitate depositing the one or more sacrificial layers 402 can include, but are not limited to: ALD, CVD (e.g., HPD CVD), PVD, a combination thereof, and/or the like.

At 1304, the method 1300 can comprise replacing the one or more sacrificial layers 402 with one or more metal contact layers to form one or more metal contacts (e.g., one or more bottom contacts 104) that can be in electrical communication with the one or more S/D regions (e.g., bottom S/D regions) and/or can at least partially surround the one or more bases 120 of the one or more semiconductor fins 118 comprised within the one or more VFET devices 102. For example, the replacing at 1304 can be performed in accordance with the tenth and/or the eleventh stages of manufacturing described herein. For instance, the replacing at 1304 can comprise forming one or more via holes through the semiconductor device 100 to expose the one or more sacrificial layers 402 to one or more etching processes. Additionally, the one or more etching processes can remove the one or more sacrificial layers 402, thereby forming one or more empty cavities 1102. Further, the replacing at 1304 can comprise depositing the one or more metal contact layers into the one or more via holes and/or cavities 1102 to form the one or more metal contacts (e.g., the one or more bottom contacts 104). For example, FIGS. 11A-12B can illustrate forming the one or more via holes and/or cavities 1102 and/or depositing the one or more metal contact layers (e.g., materials comprised within the one or more bottom contacts 104). Example etching processes that can facilitate the replacing at 1304 can include, but are not limited to: RIE, wet etching, dry etching, plasma etching, sputter etching, a combination thereof, and/or the like. Also, example deposition processes that can facilitate the replacing at 1304 can include, but are not limited to: ALD, CVD (e.g., HPD CVD), PVD, a combination thereof, and/or the like.

Figure 14:
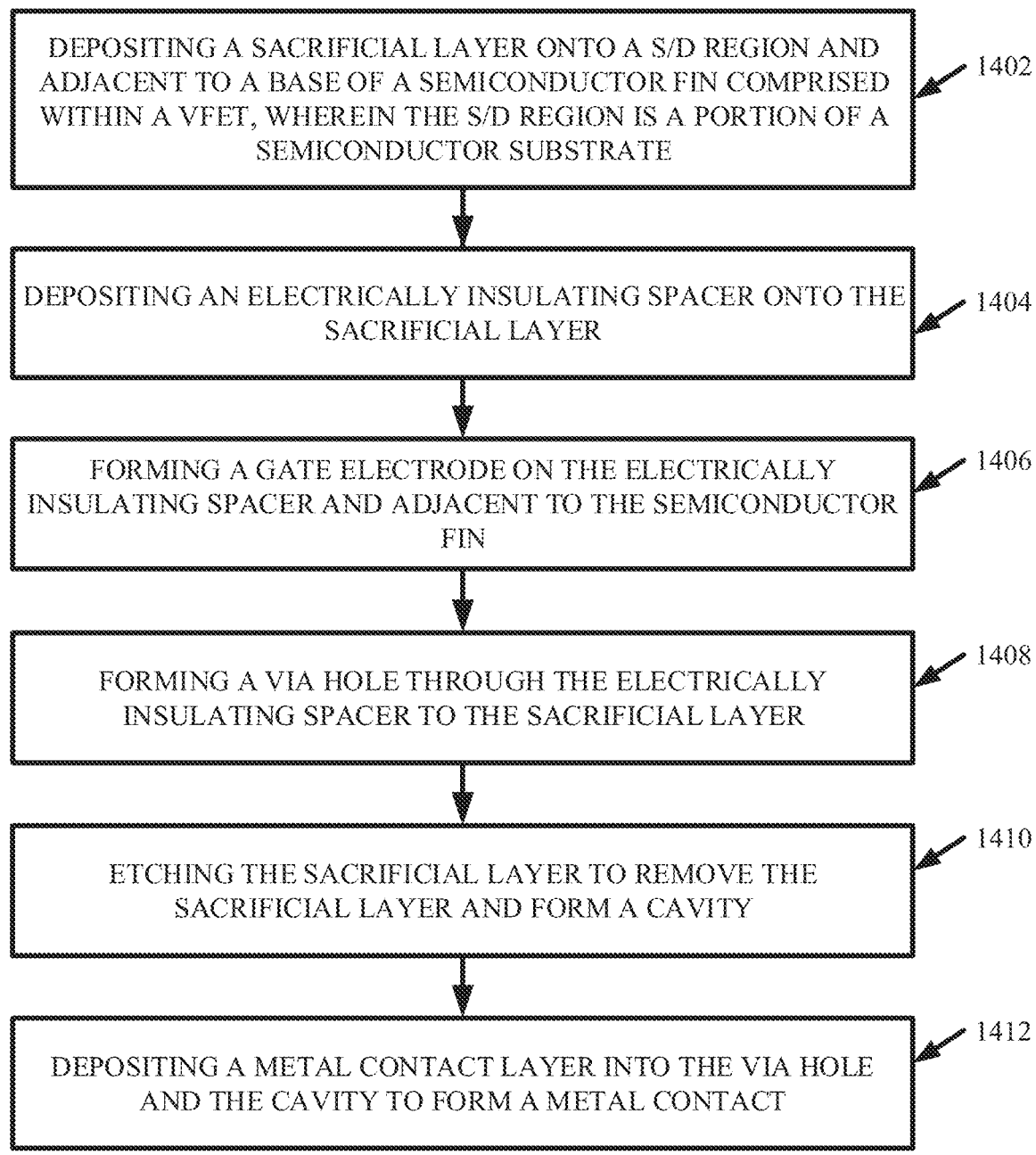
FIG. 14 illustrates a flow diagram of an example, non-limiting method that can facilitate manufacturing of one or more semiconductor devices comprising one or more VFETs operably coupled to one or more bottom contacts with low electrical resistance in accordance with one or more embodiments described herein.

FIG. 14 illustrates a flow diagram of an example, non-limiting method 1400 that can facilitate manufacturing one or more semiconductor devices 100 in accordance with one or more embodiments described herein. Repetitive description of like elements employed in other embodiments described herein is omitted for sake of brevity.

At 1402, the method 1400 can comprise depositing one or more sacrificial layers 402 onto one or more S/D regions (e.g., bottom S/D regions) and/or adjacent to one or more bases 120 of one or more semiconductor fins 118 comprised within one or more VFET devices 102. The one or more S/D regions can be a portion of a semiconductor substrate 106. For example, the depositing at 1402 can be performed in accordance with the third stage of manufacturing described herein. The one or more sacrificial layers 402 can be deposited at least partially surrounding the one or more bases 120. Example deposition processes that can facilitate depositing the one or more sacrificial layers 402 can include, but are not limited to: ALD, CVD (e.g., HPD CVD), PVD, a combination thereof, and/or the like.

At 1404, the method 1400 can comprise depositing one or more electrically insulating spacers (e.g., one or more bottom spacers 112) onto the one or more sacrificial layers 402. For example, the depositing at 1404 can be performed in accordance with the eighth stage of manufacturing described herein. For instance, depositing the one or more electrically insulating spacers (e.g., one or more bottom spacers 112) can encapsulated and/or other seal the one or more sacrificial layers 402. As a result of the depositing at 1404, the one or more sacrificial layers 402 can be positioned between a bottom S/D region and one or more bottom spacers 112 of the one or more VFET devices 102.

At 1406, the method 1400 can comprise forming one or more gate electrodes (e.g., one or more metal gate structures 124) on the one or more electrically insulating spacers (e.g., the one or more bottom spacers 112) and/or adjacent to the one or more semiconductor fins 118. For example, the forming at 1406 can be performed in accordance with the ninth stage of manufacturing described herein. For instance, the forming at 1406 can comprise forming the one or more metal gate structures 124 at one or more center portions of the one or more semiconductor fins 118. Example deposition processes that can facilitate forming the one or more gate electrodes can include, but are not limited to: ALD, CVD (e.g., HPD CVD), PVD, a combination thereof, and/or the like.

At 1408, the method 1400 can comprise forming one or more via holes through the one or more electrically insulating spacers (e.g., through the one or more bottom spacers 112) to the one or more sacrificial layers 402. For example, the forming at 1408 can be performed in accordance with the tenth stage of manufacturing described herein. For instance, the one or more via holes can extend vertically (e.g., along the "Y" axis) through one or more second ILD layers 116, one or more top spacers 114, and/or one or more bottom spacers 112 as illustrated in FIG. 11B. Example etching processes that can facilitate forming the one or more via holes can include, but are not limited to: RIE, wet etching, dry etching, plasma etching, sputter etching, a combination thereof, and/or the like.

At 1410, the method 1400 can comprise etching the one or more sacrificial layers 402 to remove the one or more sacrificial layers 402 and/or form one or more cavities 1102. For example, the etching at 1410 can be performed in accordance with the tenth stage of manufacturing described herein. For instance, the etching at 1410 can remove all, or substantially all, of the one or more sacrificial layers 402 to form the one or more cavities 1102. In another instance, the etching at 1410 can remove a portion of the one or more sacrificial layers 402 to form the one or more cavities 1102. Example etching processes that can facilitate removing the one or more sacrificial layers 402 can include, but are not limited to: RIE, wet etching, dry etching, plasma etching, sputter etching, a combination thereof, and/or the like.

At 1412, the method 1400 can comprise depositing one or more metal contact layers into the one or more via holes and/or the one or more cavities 1102 to form one or more metal contacts (e.g., one or more bottom contacts 104). For example, the depositing at 1412 can be performed in accordance with the eleventh stage of manufacturing described herein. For instance, one or more metal materials can be deposited into the one or more via holes and/or the one or more cavities 1102 as illustrated in FIGS. 12A-12B. Example deposition processes that can facilitate forming the one or more metal contacts (e.g., the one or more bottom contacts 104) can include, but are not limited to: ALD, CVD (e.g., HPD CVD), PVD, a combination thereof, and/or the like.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
a vertical field-effect transistor device comprising a semiconductor fin positioned on a bottom source/drain region comprising a semiconductor substrate; and
a metal contact layer positioned directly on top of the bottom source/drain region and at least partially surrounding a base of the semiconductor fin, wherein the metal contact layer is in electrical communication with the bottom source/drain region, and wherein the metal contact layer comprises a first portion parallel to the semiconductor fin, and a second portion that extends perpendicular to the first portion, wherein the second portion is at least partially surrounded by an insulating layer, and wherein the first portion is at least partially surrounded by a top spacer and a bottom spacer, wherein the top spacer is in contact with the bottom spacer.

2. The apparatus of claim 1, wherein a first side of the metal contact layer is in contact with the bottom source/drain region, wherein a second side of the metal contact layer is in contact with an electrically insulating spacer layer, and wherein the first side of the metal contact layer is opposite the second side of the metal contact layer.

3. The apparatus of claim 2, wherein the electrically insulating spacer layer is positioned between the metal contact layer and a gate electrode of the vertical field-effect transistor device.

4. The apparatus of claim 3, wherein the semiconductor substrate is an epitaxial wafer, wherein the metal contact layer comprises a first material selected from a first group consisting of titanium, titanium nitride, and tungsten, and wherein the electrically insulating spacer layer comprises a second material selected from a second group consisting of silicon nitride, silicon-boron-carbide-nitride, silaketenylidene, and silicon oxycarbonitride.

5. The apparatus of claim 1, wherein the semiconductor fin extends from the base of the semiconductor fin to a second source/drain region.

6. The apparatus of claim 1, wherein the metal contact layer extends around a plurality of sidewalls of the base of the semiconductor fin.

7. The apparatus of claim 1, wherein the metal contact layer is positioned adjacent to, and in contact with, all sidewalls of the base of the semiconductor fin.

8. An apparatus, comprising:
a vertical field-effect transistor device comprising a semiconductor fin extending from an epitaxial wafer; and
a metal contact layer positioned directly on top of the epitaxial wafer and at least partially surrounding a base of the semiconductor fin, wherein the metal contact layer is in contact with the base of the semiconductor fin and the epitaxial wafer, and wherein the metal contact layer comprises a first portion that extends parallel to the semiconductor fin, and a second portion that extends perpendicular to the first portion, wherein the second portion is at least partially surrounded by an insulating layer, and wherein the first portion is at least partially surrounded by a top spacer and a bottom spacer, wherein the top spacer is in contact with the bottom spacer.

9. The apparatus of claim 8, wherein a portion of the epitaxial wafer is a source/drain region for the vertical field-effect transistor device and is in contact with the base of the semiconductor fin.

10. The apparatus of claim 9, wherein a first side of the metal contact layer is in contact with the source/drain region, wherein a second side of the metal contact layer is in contact with an electrically insulating spacer layer, and wherein the first side of the metal contact layer is opposite the second side of the metal contact layer.

11. The apparatus of claim 10, wherein the electrically insulating spacer layer is positioned between the metal contact layer and a gate electrode of the vertical field-effect transistor device.

12. The apparatus of claim 11, wherein the epitaxial wafer comprises silicon, wherein the metal contact layer comprises a first material selected from a first group consisting of titanium, titanium nitride, and tungsten, and wherein the electrically insulating spacer layer comprises a second material selected from a second group consisting of silicon nitride, silicon-boron-carbide-nitride, silaketenylidene, and silicon oxycarbonitride.

13. The apparatus of claim 8, wherein the metal contact layer is adjacent to a plurality of sidewalls of the base of the semiconductor fin.

* * * * *